US010688490B2

(12) United States Patent
Bridle et al.

(10) Patent No.: US 10,688,490 B2
(45) Date of Patent: Jun. 23, 2020

(54) MICROFLUIDIC DEVICE

(71) Applicant: HERIOT-WATT UNIVERSITY, Edinburgh (GB)

(72) Inventors: Helen Louise Bridle, Edinburgh (GB); Brian Maxdell Miller, Edinburgh (GB)

(73) Assignee: HERIOT-WATT UNIVERSITY, Edinburgh (GB)

( * ) Notice: Subject to any disclaimer, the term of this patent is extended or adjusted under 35 U.S.C. 154(b) by 194 days.

(21) Appl. No.: 15/580,359

(22) PCT Filed: Jun. 10, 2016

(86) PCT No.: PCT/GB2016/051713
§ 371 (c)(1),
(2) Date: Dec. 7, 2017

(87) PCT Pub. No.: WO2016/198880
PCT Pub. Date: Dec. 15, 2016

(65) Prior Publication Data
US 2018/0185845 A1 Jul. 5, 2018

(30) Foreign Application Priority Data
Jun. 11, 2015 (GB) .................................. 1510189.2

(51) Int. Cl.
*B01L 3/00* (2006.01)
*B81B 1/00* (2006.01)
*B01F 5/00* (2006.01)

(52) U.S. Cl.
CPC ... *B01L 3/502761* (2013.01); *B01L 3/502753* (2013.01); *B01L 3/502776* (2013.01);
(Continued)

(58) Field of Classification Search
CPC ..... B01L 2200/0636; B01L 2200/0652; B01L 2300/0816; B01L 2300/0864;
(Continued)

(56) References Cited

U.S. PATENT DOCUMENTS

2006/0087918 A1* 4/2006 Ji .......................... B01F 5/0646
366/341
2009/0114607 A1* 5/2009 Lean ...................... B03B 5/626
210/779
(Continued)

FOREIGN PATENT DOCUMENTS

EP 2060312 A2 5/2009
EP 2127752 A2 12/2009
(Continued)

OTHER PUBLICATIONS

International Search Report and Written Opinion dated Aug. 29, 2016 for PCT Application No. PCT/GB2016/051713.
(Continued)

*Primary Examiner* — Jennifer Wecker
(74) *Attorney, Agent, or Firm* — Moser Taboada

(57) ABSTRACT

There is presented a microfluidic device comprising a plurality of layers and a common manifold, wherein a fluid comprising a target population of particles having a specified range of diameters may be processed by the device by flowing from the common manifold through the channels of each layer within the plurality of layers, and fluid collected from a first outlet of each layer within the plurality of layers comprises the target population of particles, and fluid collected from a second outlet of each layer within the plurality of layers is substantially devoid of the target population of particles. A method of use of said device and systems comprising at least one said device are also presented.

31 Claims, 14 Drawing Sheets

(52) U.S. Cl.
CPC .................. *B01L 2200/0636* (2013.01); *B01L 2200/0652* (2013.01); *B01L 2300/088* (2013.01); *B01L 2300/0816* (2013.01); *B01L 2300/0864* (2013.01); *B01L 2300/0887* (2013.01); *B01L 2300/161* (2013.01)

(58) Field of Classification Search
CPC ....... B01L 2300/088; B01L 2300/0887; B01L 2300/161; B01L 3/502753; B01L 3/502761; B01L 3/502776
See application file for complete search history.

(56) References Cited

U.S. PATENT DOCUMENTS

2009/0283455 A1* 11/2009 Lean ......................... B03B 5/32 209/555
2010/0003666 A1* 1/2010 Lee ................... B01L 3/502761 435/5
2011/0096327 A1 4/2011 Papautsky et al.
2012/0121481 A1* 5/2012 Romanowsky ....... B01F 3/0807 422/502
2014/0248621 A1 9/2014 Collins
2014/0273179 A1* 9/2014 Sharpe ............... G01N 15/1484 435/283.1
2016/0158751 A1* 6/2016 Konstantopoulos ......................... B01L 3/502761 435/29
2016/0243547 A1* 8/2016 Bar-Ziv .................. C12P 21/02

FOREIGN PATENT DOCUMENTS

WO WO 2011/109762 A1 9/2011
WO WO 2014/113598 A2 7/2014
WO WO 2015/057159 A1 4/2015

OTHER PUBLICATIONS

J. Zhou et al. "Fundamentals of inertial focusing in microchannels", The Royal Society of Chemistry, 2013, DOI: 10/1039/c21c41248a, RSC Publishing, 12 pgs.

* cited by examiner

MICROFLUIDIC DEVICE

The invention relates to the field of microfluidic devices, more specifically to microfluidic devices for concentrating and/or filtering fluid samples containing particulates.

BACKGROUND OF THE INVENTION

There are many applications where particulates are required to be separated from or detected in a liquid medium. For example, it is important to be able to detect and potentially remove particulates from water to allow water quality monitoring and treatment, or to allow the efficient removal or purification of cells within a medium, such as culture medium, or a bodily fluid such as blood.

The processing of liquid to remove or to detect particulate contaminants is of especial importance for detecting and/or removing water borne pathogens, such as *Cryptosporidium* or *Giardia*, for example, in and/or from water supplies. Other examples include the separation of cells from a medium, such as cell culture or a bodily fluid such as blood, for example.

Microfluidic devices are used to process small volumes of liquid (between 15 μl/min and 5 ml/min)[1,2] and typically comprise a detector, such as a biosensor, for example. Accordingly, such devices are able to successfully detect very small concentrations of particulates or other contaminants. However, detection of biological species, for example, require small concentrated samples, and therefore, the use of biosensor devices and other detection devices for environmental monitoring are often limited by the low volumetric throughput and the time required to process a statistically relevant sample of treated water being too long for real world application.

Highly parallelised arrays of microfluidic devices[3-5] allow a higher volume of liquid to be processed in a given timescale, or to carry out pre-processing of samples to concentrate and/or enrich samples to be tested. However, such arrays typically greatly increase the footprint and cost of the device, which in turn limits the applicability of such devices.

Therefore, there remains a need for a device that allows a high throughput of liquid to be processed in a realistic timescale that is cost effective and has a small footprint.

Typically, devices employ a form of filtration of the liquid to be processed to allow the particulates to be detected or collected for analysis. However, over time, especially in cases where the volume of liquid to be processed is high, the filters used typically become clogged or blocked with particulates, and must be replaced before further volumes of liquid can be processed.

Accordingly, it is an object of the present invention to provide an improved device for processing of large volumes of fluid.

STATEMENTS OF THE INVENTION

According to a first aspect of the invention there is provided a microfluidic device comprising a plurality of layers and a common manifold, each layer within the plurality of layers comprises an inlet and at least two outlets, the inlet being in fluid communication with each of the at least two outlets via a channel, the inlet of each layer within the plurality of layers being in fluid communication with the common manifold, such that fluid may flow from the common manifold through each channel of each layer within the plurality of layers via the inlets of each respective layer to the at least two outlets of each layer, such that, during use, a fluid comprising a target population of particles having a specified range of diameters may be processed by the device by flowing from the common manifold through the channels of each layer within the plurality of layers via the inlets of those layers, and fluid collected from a first outlet of each layer within the plurality of layers comprises the target population of particles, and fluid collected from a second outlet of each layer within the plurality of layers is substantially devoid of the target population of particles.

Preferably, the channel of each layer within the plurality of layers is dimensioned such that the target population of particles that may be present within a fluid to be processed by the device is focussed by the device into only one of the at least two outlets, if present. The first outlet of each layer within the plurality of layers may be a focussed outlet and the target population of particles may be focussed within the channel and pass through the focussed outlet only. The second outlet may be an unfocussed outlet and fluid passing through the second outlet may be substantially devoid of the target population of particles.

Fluid processing devices known in the art typically require the use of filters to selectively remove target populations of particles from a fluid. The target population of particles will be collected on the filter and build up until the filters become clogged and must be replaced or cleaned to allow the device to continue working.

The provision of a device according to the present aspect allows a target population of particles to be selectively removed from a bulk fluid without the use of filters and therefore, without requiring the periodic cleaning or replacement of said filters.

Furthermore, the volume of fluid comprising the target population of particles is reduced once it has been processed by the device of the invention, and therefore, the device of the invention allows the concentration of a target population of particles to be increased, to allow that target population of particles to be more readily detected, for example.

Preferably, the common manifold is configured to ensure that the flow rate of fluid passing through the channel of each layer within the plurality of layers is substantially the same.

Without wishing to be bound by theory, the inventors suggest that the ability of the device to ensure that the target population of particles are present in fluid collected from the first outlet only is dependent on flow rate of the fluid being processed, among other things such as channel dimensions relative to the target particle diameter, etc. Therefore, it is crucial that the flow rate of fluid passing through each channel of the device is substantially the same.

The provision of a common manifold to provide fluid at a common flow rate to the inlet of each layer of the device ensures that each layer of the device will process the fluid in the same way i.e. the first outlet of each layer will comprise the same target population of particles. Accordingly, the plurality of layers of the device of the present invention process fluid in parallel, thereby allowing a large volume of fluid to be processed by the device at once, even though the volume that may be processed by each channel may be small. For example, in embodiments where the plurality of layers comprises 20 layers, the device may be configured to process 1 L/min, but each layer may only be capable of processing 30-80 mL/min.

Furthermore, the provision of a common manifold allows the fluid to be processed by the device to be introduced into the device by a single input (the input of the common manifold) and therefore, only requires the provision of a single pressure source, such as a single pump, and a single set of fittings to be used, for example. Using a single pump, or other single pressure source, allows the flow rate through the inlets, and therefore the channels, of each layer within the plurality of layers to be much more readily controlled and balanced to ensure that the flow rate through each channel is substantially the same. Furthermore, a device requiring only a single set of fittings and a single pressure source will typically reduce the space required to connect the channels of the device to the pressure source. Accordingly, the device of the invention is a simple solution for processing of fluids, and is more cost efficient and space efficient than devices known in the art.

Preferably, the common manifold comprises a single inlet. The common manifold may comprise a branched portion. The common manifold may comprise a manifold outlet. The manifold outlet may be in direct fluid communication with the inlet of the channel of each layer within the plurality of layers, such that fluid may flow from the single inlet of the common manifold to the inlet of each layer within the plurality of layers via the branched portion and the manifold outlet of the common manifold.

The manifold outlet may be elongate.

Typically, the common manifold is connected to the plurality of layers of the device via a sealing means. The sealing means may be located between the device and the common manifold. The sealing means may provide a fluid-tight seal to ensure that fluid from the common manifold flows into the inlet of each layer within the plurality of layers of the device without leaking out at the interface between the common manifold and the device. Typically, the sealing means is formed from an elastic material that may be deformed by urging the common manifold towards the contact point between the common manifold and the device. For example, the sealing means may be a gasket that is formed of rubber or similar.

The channel of each layer within the plurality of layers may be linear.

Preferably, the channel of each layer within the plurality of layers is curved. The channel of each layer within the plurality of layers may form an arc. The curvature of the channel may be constant along the length of the channel. Preferably, the channel of each layer within the plurality of layers forms a spiral. Accordingly, the curvature of the channel may vary along the length of the channel. Typically, the sign of curvature of the channel does not change i.e. the concave wall of the channel remains the concave wall of the channel along the length of the curved channel, and the convex wall of the channel remains the convex wall of the channel along the length of the curved channel. Alternatively, the sign of curvature of the channel may change, and the channel may be serpentine. However, a serpentine channel may form complex flows within the channel and therefore, may produce less effective focusing of the target population of particles to the first outlet of each layer within the plurality of layers.

It has been found that suspended particles passing through a curved channel will tend to be focussed to an equilibrium point within the channel, and the position of the equilibrium point depends primarily on the diameter of the particle, and by shape and deformability of the particle to a lesser extent. Generally, the greater the degree of curvature, the greater the inertial forces that will act on a particle suspended in fluid passing through the channel, and therefore the shorter the distance particles must travel along the channel to be focussed to the equilibrium point within the channel.

For example, in one embodiment of the invention the channel forms a spiral and the maximum radius of the channel is 10 cm.

Preferably, during use, fluid passes through each layer within the plurality of layers in parallel.

The inlet of each layer within the plurality of layers may be open. The at least two outlets of each layer within the plurality of layers may be open. The inlet and the at least two outlets of each layer within the plurality of layers may be open. The flow rates of each layer within the plurality of layers may be more readily balanced or equalised where the inlet and the at least to outlets of each layer are open, and therefore, allow each layer within the plurality of layers to process fluid in the same way (i.e. focusing particles of the same target diameter).

Preferably, the plurality of layers form a stack of layers such that each layer within the stack of layers substantially covers the preceding layer within the stack. Preferably, the inlets of each layer within the stack of layers are equally spaced apart. Accordingly, the footprint of the device is substantially the footprint of a single layer. Therefore, the device may be more space efficient and thereby more cost efficient than devices in the art that comprise interleaved layers or comprise a plurality of channels in a single plane.

Preferably, the channel of each layer within the plurality of layers has substantially the same dimensions. Preferably, the width of the channel of each layer within the plurality of layers is about three to about ten times the height of the channel of each layer within the plurality of layers. More preferably, the width of the channel of each layer within the plurality of layers is about four to about seven times the height of the channel. More preferably, the width of the channel of each layer within the plurality of layers is about six times the height of the channel.

The plurality of layers may comprise at least two layers. Preferably, the plurality of layers comprises at least ten layers. More preferably, the plurality of layers comprises at least twenty layers. For example, the plurality of layers may comprise 5, 10, 20, 30, 40, 50, 60, 70, 80, 90, or 100 layers.

The number of layers of the device can be tailored to suit the volume of fluid that is required to be processed in a given time, and therefore, the device of the invention provides greater flexibility and greater potential volume capacity than other devices known in the art.

Preferably, the channel of each layer within the plurality of layers is of a length that is sufficient for target populations of particles within fluid flowing through the channel may be focussed to the first outlet of the layer only. For example, in embodiments where the channel is curved, the channel is of sufficient length that during use Dean flows have been established within the channel and inertial focusing has focussed the target population of particles such that the target population of particles pass through the first outlet only.

For example, a spiral channel comprising 6 loops and having a minimum dimension (e.g. channel height) of 500 μm may require a channel length of approximately 1.3 m to focus particles having a diameter of about 125 μm. In another example, a spiral channel comprising 6 loops and having a minimum dimension of 30 μm may require a channel length of approximately 8 cm to focus particles having a diameter of about 3.6 μm.

Each layer within the plurality of layers may comprise at least three outlets. The channel of each layer within the plurality of layers may focus two target populations of particles into two separate regions of the channel. Accordingly, fluid comprising a first target population of particles may pass through the first outlet, fluid comprising a second target population of particles may pass through a second outlet, and fluid substantially devoid of the first and second populations of particles may pass through the third outlet.

Each layer within the plurality of layers may comprise an expansion chamber between the at least two outlets and the channel of that layer. The expansion chamber may have a larger cross-sectional area than the channel such that the flow rate of fluid is reduced as the fluid enters the expansion chamber from the channel.

The provision of an expansion chamber may allow particles within the fluid being processed by the device to be more readily observed and thereby identified. Accordingly, the provision of a device comprising an expansion chamber may allow possible contaminants within the fluid being processed to be identified to allow the determination of whether the fluid should be further processed or tested, for example.

The expansion chamber may comprise a divider. The divider may divide the fluid passing through the expansion chamber into fluid that will flow to the first outlet, and fluid that will flow through the second outlet. Accordingly, during use, the divider may direct fluid comprising the target population of particles to the first outlet, and the divider may direct fluid substantially devoid of the target population of particles to the second outlet.

The expansion chamber may comprise more than one divider. For example, in embodiments where each layer within the plurality of layers comprises three outlets, the expansion chamber may comprise a first divider and a second divider. The first divider may divide fluid comprising a first target population of particles into the first outlet and fluid substantially devoid of the first target population of particles into the second outlet. The second divider may divide fluid comprising a second target population of particles into the second outlet and fluid substantially devoid of the second population of particles into the third outlet. Alternatively, the first divider may divide fluid comprising a first population of particles into the first outlet and fluid substantially devoid of the first population of particles may be directed by the first divider towards the second and third outlets. The second divider may divide this fluid directed by the first divider into fluid comprising a second population of particles, which is directed to the second outlet, and fluid substantially devoid of the second population of particles, which is directed to the third outlet.

Preferably, the channel of each layer within the plurality of layers is dimensioned to ensure that, during use, particles having a target diameter passing through the channel are focussed to one side of the channel. Typically, the channel of each layer within the plurality of layers is dimensioned such that competing forces acting on particles having the target diameter are minimised in a common region of the channel, forming an equilibrium point, and such "focussed" particles will exit the layer via the first outlet only, for example.

Without wishing to be bound by theory, the inventors suggest that the competing forces of shear-induced lift, wall-induced lift, and in embodiments where the channel is curved, centrifugal forces and Dean drag forces caused by Dean flows that compensate for the centrifugal force, create a different equilibrium point within the channel for particles of different diameters, thereby allowing particles of different diameters to be separated and a target population of particles to be removed from the bulk of the fluid, or concentrated into a reduced volume of fluid.

In embodiments where the channel is curved, an equilibrium point is formed near the inner wall of the channel for particles with a diameter that is a certain ratio of the width of the channel. The location of this equilibrium point is typically dependent on particle diameter, channel configuration and dimensions, fluid viscosity and fluid flow rate. This type of focusing of particles is often termed "inertial focusing" in the art.[6,7] For example, the inventors have found that a spiral channel comprising 6 loops, having a width of 3 mm, a height of 0.5 mm and an outer diameter of 20 cm at the outside ring of the spiral, and for a fluid flow rate of between 30 mL/min and 70 mL/min will focus particles in water having a dimension of between about 0.125 mm and about 0.49 mm into the first outlet only.

For a given degree of curvature of the channel, and for a given flow rate, a channel with a height of about 30 μm and a width of about 180 μm may focus particles having a diameter of at least 3.6 μm. A channel having a height of about 300 μm and width of about 1,800 μm may focus particles having a diameter of at least 36 μm.

Suitably, a channel may focus particles having the minimum diameter as defined above, up to a maximum diameter that may freely pass through the channel. For example, for a channel that has a height of about 30 μm and a width of about 180 μm may focus particles having a diameter of between about 3.6 μm and about 25 μm.

Typically, during use the device is used to process water, or an aqueous fluid. For example, the device may be used to process water to remove large particulates from the water, which in turn may allow the water to be tested for smaller waterborne pathogens more easily. In another example, the device may be used to process bodily fluids, such as blood, to remove cells, such as stem cells or blood cells. In a further example, the device may be used to purify algal species for use in biofuel applications.

In a further example, the fluid may be an oil, and the device may be used to remove particulates from the oil. For example, the device may be used for oil filtration units for heavy rotating machinery, such as gas turbines, diesel and petrol engines, etc. Oil from the machinery may be fed into the inlet of the common manifold. The first outlet of each layer within the plurality of layers may feed into a "dirty" reservoir, which collects particulates to be cleaned/flushed from the system. The second outlet of each layer within the plurality of layers may feed into a "clean" reservoir, which may be "topped-up" equal to the oil removed to the first outlet. Accordingly, the machinery may run without needing a full oil change. In another example, clean oil may be recovered from dirty waste oil, effectively filtering the oil to clean it again for re-use without needing to replace filters, for example.

The channel of each layer within the plurality of layers may comprise a coating. An interior surface or interior surfaces of the channel of each layer may comprise a coating that resists binding by particles within the fluid. In embodiments where the fluid comprises cells, such as blood cells, or stem cells, for example, the coating may resist or prevent cells binding to the surfaces of the channel to prevent a build-up of material on the interior of the channels that may restrict or eventually prevent the flow of fluid through the channel. For example, the coating may comprise PTFE, a polyethylene glycol (PEG) or similar. The coating may comprise a blocking protein, such as bovine serum albumin (BSA), for example. In embodiments where the channel comprises a silicate material, such as glass, the coating may comprise a silane.

During use, fluid collected from the first outlet of each layer within the plurality of layers comprising a target population of particles may be further processed by the device of the first aspect by feeding in that fluid into the inlet of the common manifold. Accordingly, the volume of fluid comprising the target population of particles may be reduced, thereby concentrating the target population of particles to allow that target population of particles to be more readily detected, for example. Furthermore, reducing the volume of fluid comprising the target population of particles may allow a greater volume of fluid that is substantially devoid of the target population of particles to be collected, thereby effectively filtering the fluid of the target population of particles.

A plurality of devices according to the present aspect may be connected in parallel by a further common manifold. The further common manifold may be in fluid communication with the inlet of each common manifold of each device within the plurality of devices such that fluid may flow from the further common manifold through each common manifold of each device within the plurality of devices via the inputs of each respective common manifold to the at least two outlets of each layer of each device within the plurality of devices. The further common manifold may be configured to ensure that the flow rate of fluid passing through the inlet of each common manifold of each device within the plurality of devices is substantially the same.

Accordingly, the use of a plurality of devices connected by a further common manifold may allow a much larger volume of fluid to be processed in a uniform manner. I.e., the flow rate of fluid passing through each layer of each device is substantially the same such that substantially the same target population of particles are focussed by each layer of each device in the plurality of devices.

Furthermore, fluid processed by the plurality of devices may be driven by a single pump, thereby saving costs and ensuring uniformity of pumping across the plurality of devices.

The plurality of devices may comprise at least 20 devices, at least 30 devices, at least 50 devices, at least 100 devices, at least 200 devices, at least 500 devices or at least 1000 devices. The plurality of devices may comprise from two to 500 devices. The plurality of devices may comprise from two to 200 devices. The plurality of devices may comprise from two to ten devices. For example, the plurality of devices may comprise two, five, seven, ten, fifteen, twenty, twenty five or thirty devices.

The invention extends in a second aspect to a method of use of a device according to the first aspect, the method comprising the steps:

- a providing a fluid comprising a target population of particles;
- b driving the fluid into the single inlet of the common manifold of the device at a first rate of flow; and
- c collecting the fluid from the at least two outlets of each layer within the plurality of layers, wherein the fluid from a first outlet of each layer comprises the target population of particles, and fluid from the second outlet is substantially devoid of the target population of particles.

Preferably, the fluid from the first outlet comprises the majority of the target population of particles. Preferably, the fluid from the first outlet comprises substantially all of the target population of particles.

The provision of a device comprising a plurality of layers, the inlet of each layer within the plurality of layers being in fluid communication with a single pressure source, such as a pump, via a common manifold, reduces the machinery required to process large volumes of fluid, requiring only a single pump to provide fluid to each inlet, and greatly simplifying the equalising or balancing of pressure across all of the inlets for each layer within the plurality of layers of the device. Accordingly, each layer within the plurality of layers processes the fluid passing through it in substantially the same way as every other layer within the plurality of layers.

Preferably, in embodiments where the minor dimension of the channel is the height, the diameter of the target population of particles is about one sixth the height of the channel of each layer. The target population of particles may have a range of diameters, and the average diameter may be about one sixth the height of the channel of each layer. Alternatively, the target population of particles may have a range of diameters the minimum of which is one sixth the height of the channel of each layer.

The relationship between the dimensions of the channel of each layer within the plurality of layers and the diameter of particles focussed by the device may change as the dimensions of the channel are reduced beyond a threshold size. For example, in embodiments where the height of the channel is the minor dimension, above the threshold size, the channels of each layer within the plurality of layers may focus particles having a diameter of at least one sixth the height of the channel, and below the threshold size, the channels of each layer within the plurality of layers may focus particles having a diameter of at least one tenth the height of the channel.

Typically, a population of particles can be expected to be focussed by a given channel if the particle diameter divided by the effective hydraulic diameter of the channel is greater than or equal to 0.07. The hydraulic diameter of the channel may be calculated using the following formula:

$$D_H = \frac{2ab}{a+b} \tag{1}$$

where $D_H$ is the hydraulic diameter, a is the width of the channel and b is the height of the channel.

The fluid may comprise one or more populations of particles having a diameter that falls outside the range of diameters of the target population of particles. The fluid from the first outlet may comprise particles outside the target population of particles. The fluid from the second outlet may comprise particles outside the target population. The fluid from both the first outlet and the second outlet may comprise particles outside the target population.

Fluid collected from the first outlet may be further processed by the device of the first aspect by feeding that fluid into the inlet of the common manifold. Accordingly, the volume of the fluid comprising the target population of particles may be reduced, thereby concentrating the target population of particles to allow that target population of particles to be more readily detected, for example. In addition, reducing the volume of fluid comprising the target population of particles may allow a greater volume of fluid that is substantially devoid of the target population of particles to be collected, thereby effectively filtering the fluid of the target population of particles.

According to a third aspect of the invention, there is presented a system for removing populations of particles from a fluid comprising a plurality of devices according to the first aspect of the invention, the second outlet of a first device is in fluid communication with the inlet of a subsequent device, wherein the channels of the first device are dimensioned to focus particles of a first range of diameters into the first outlet of the first device, and the channels of the second device are dimensioned to focus particles of a second range of diameters into the first outlet of the second device, such that fluid comprising populations of particles with diameters within the first and/or second range of diameters may be sequentially removed from the fluid as the fluid passes through the plurality of devices.

Preferably, fluid is processed by each device in the system using the method of the second aspect.

Preferably, the diameter or range of diameters of the target populations removed by each subsequent device within the system may be smaller than the previous device, such that each subsequent device removes smaller particles than the previous device in the system.

A target population of particles with a specific diameter or range of diameters are selectively removed from the bulk fluid by each device as the bulk fluid passes through the system. Preferably, each device within the system is configured to remove a different target population of particles than the other devices in the system. Typically, the first device in a system is configured to remove the target population of particles having the largest diameter, the second device in a system is configured to remove a target population of particles having a diameter that is smaller than that of the particles removed by the first device and so on. For example, in embodiments comprising three devices of the first aspect, the first device in the system may remove a target population of particles having a first diameter, or range of diameters (largest particles), the second device may remove a target population of particles having a second diameter, or range of diameters (second largest particles), and the third device may remove a target population of particles having a third diameter, or range of diameters (smallest particles). The resulting fluid may be substantially free of particles, or substantially free of the target populations of particles having the first to third diameters or range of diameters.

The first outlet of each layer of each device in the system of the present invention may be in fluid communication within the inlet of the common manifold of that device, such that fluid comprising the target population of particles is further processed by that device to reduce the volume of fluid comprising the target population of particles, thereby concentrating the target population of particles. Concentrating a dilute population of particles, may allow that population of particles to be more readily detected, for example. Furthermore, reprocessing fluid comprising the target population of particles may allow a greater volume of fluid that is devoid of the target population of particles to be obtained, effectively providing the function of filtering the fluid of the target population of particles.

Typically, the common manifold of each device within the plurality of devices may be in fluid communication with a reservoir for that device. The first outlet of the device may feed into the reservoir for that device such that the fluid is re-circulated through the device.

Accordingly, the system may comprise a plurality of reservoirs, each reservoirs associated with a device within the plurality of devices.

Preferably, the fluid is an aqueous liquid. For example, the fluid may be water that may be contaminated with a particles of a variety of diameters. Alternatively, the fluid may be a bodily fluid. For example, the fluid may be blood, wound fluid, plasma, serum, urine, stool, saliva, cord blood, chorionic villus samples, amniotic fluid, transcervical lavage fluid, or any combination thereof.

Fluid that has been processed by the system of the present aspect may be ready to test for particles having a target diameter. For example, water that has been processed using the system of the present aspect may be suitable for testing for the presence of water borne pathogens such as *Cryptosporidium* or *Giardia*, without requiring conventional filtration of larger particles that may otherwise be present. Alternatively, different target populations of particles may be concentrated by each device within the plurality of devices of the system of the present aspect, thereby allowing a plurality of target dilute species within a bulk fluid to be concentrated down into a smaller volume of fluid that may be more suitable for testing for that target species, for example. Accordingly, multiple target species can be concentrated up for detection by the system as the fluid is processed.

Populations of particles of a given target diameter may be concentrated by one of the devices within the system of the present aspect, and the produced concentrated population of particles of the target diameter may be sufficiently concentrated to be detected. In embodiments where the particles of a target diameter are concentrated after particles having a diameter that is larger than the target diameter have been concentrated in prior devices within the system, the particles of the target diameter may be concentrated without the presence of those larger particles.

The system may comprise a plurality of devices according to the present aspect connected in parallel by a further common manifold. The further common manifold may be in fluid communication with the inlet of each common manifold of each device within the plurality of devices such that fluid may flow from the further common manifold through each common manifold of each device within the plurality of devices via the inputs of each respective common manifold to the at least two outlets of each layer of each device within the plurality of devices. The further common manifold may be configured to ensure that the flow rate of fluid passing through the inlet of each common manifold of each device within the plurality of devices is substantially the same.

Accordingly, the use of a plurality of devices connected by a further common manifold may allow a much larger volume of fluid to be processed in a uniform manner. I.e., the flow rate of fluid passing through each layer of each device is substantially the same such that substantially the same target population of particles are focussed by each layer of each device in the plurality of devices.

Furthermore, fluid processed by the plurality of devices may be driven by a single pump, thereby saving costs and ensuring uniformity of pumping across the plurality of devices.

The plurality of devices may comprise at least 20 devices, at least 30 devices, at least 50 devices, at least 100 devices, at least 200 devices, at least 500 devices or at least 1000 devices. The plurality of devices may comprise from two to 500 devices. The plurality of devices may comprise from two to 200 devices. The plurality of devices may comprise from two to ten devices. For example, the plurality of devices may comprise two, five, seven, ten, fifteen, twenty, twenty five or thirty devices.

BRIEF DESCRIPTION OF THE FIGURES

Embodiments of the present invention will now be described, by way of non-limiting example, with reference to the accompanying drawings.

SPECIFIC DESCRIPTION OF EMBODIMENTS OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

Figure 1:
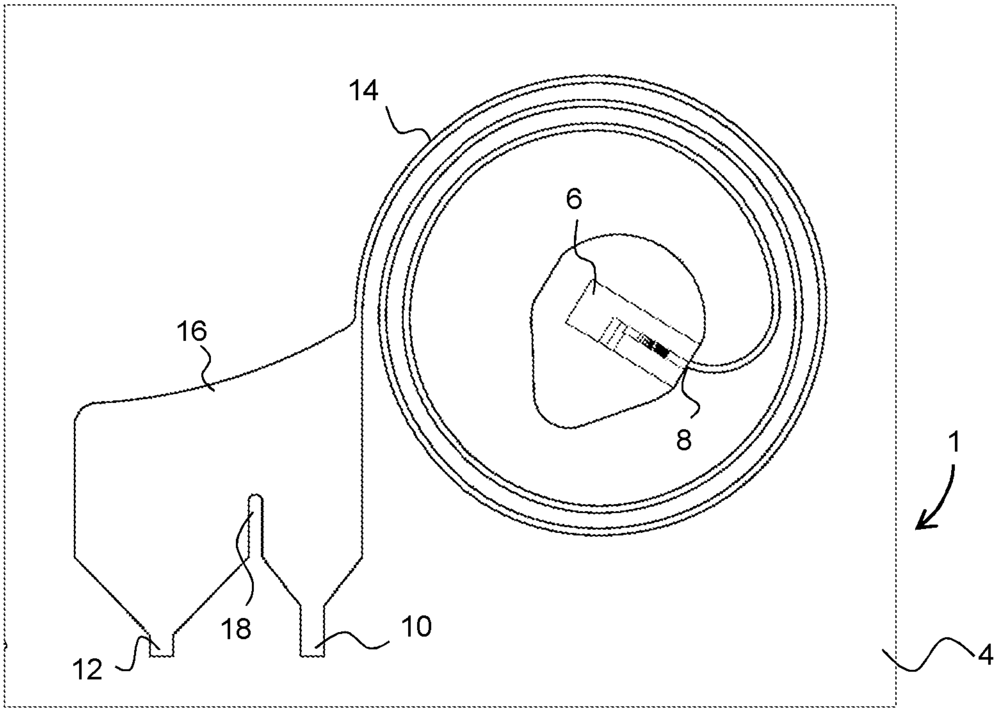
FIG. 1: a plan view from above of a device according to one embodiment of the invention.
Figure 2:
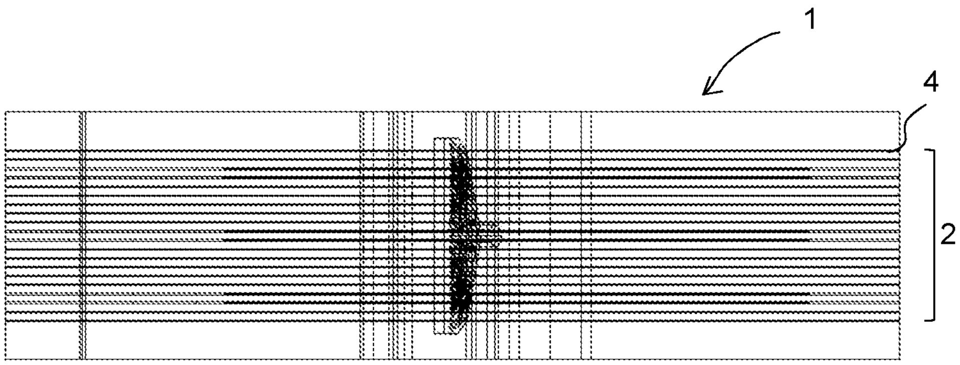
FIG. 2: Plan view from the side of a device according to one embodiment of the invention
Figure 3A:
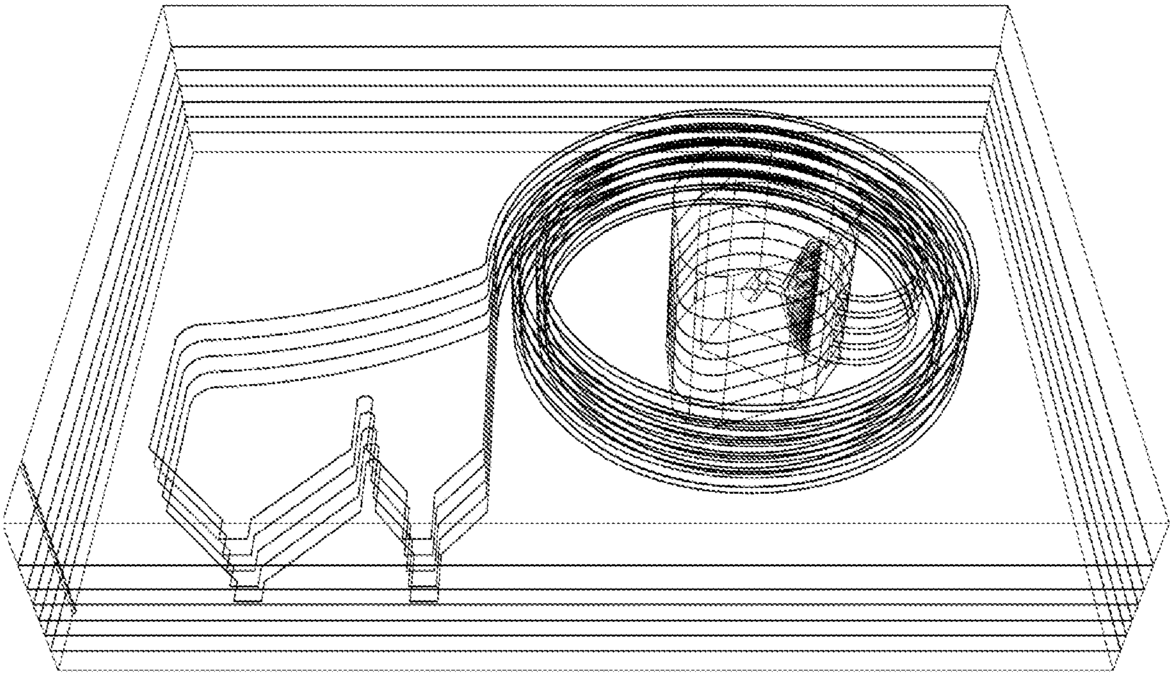
FIG. 3: A) Perspective view of a device according to one embodiment of the invention, and B) an exploded view of part of a device according to one embodiment of the invention.
Figure 3B:
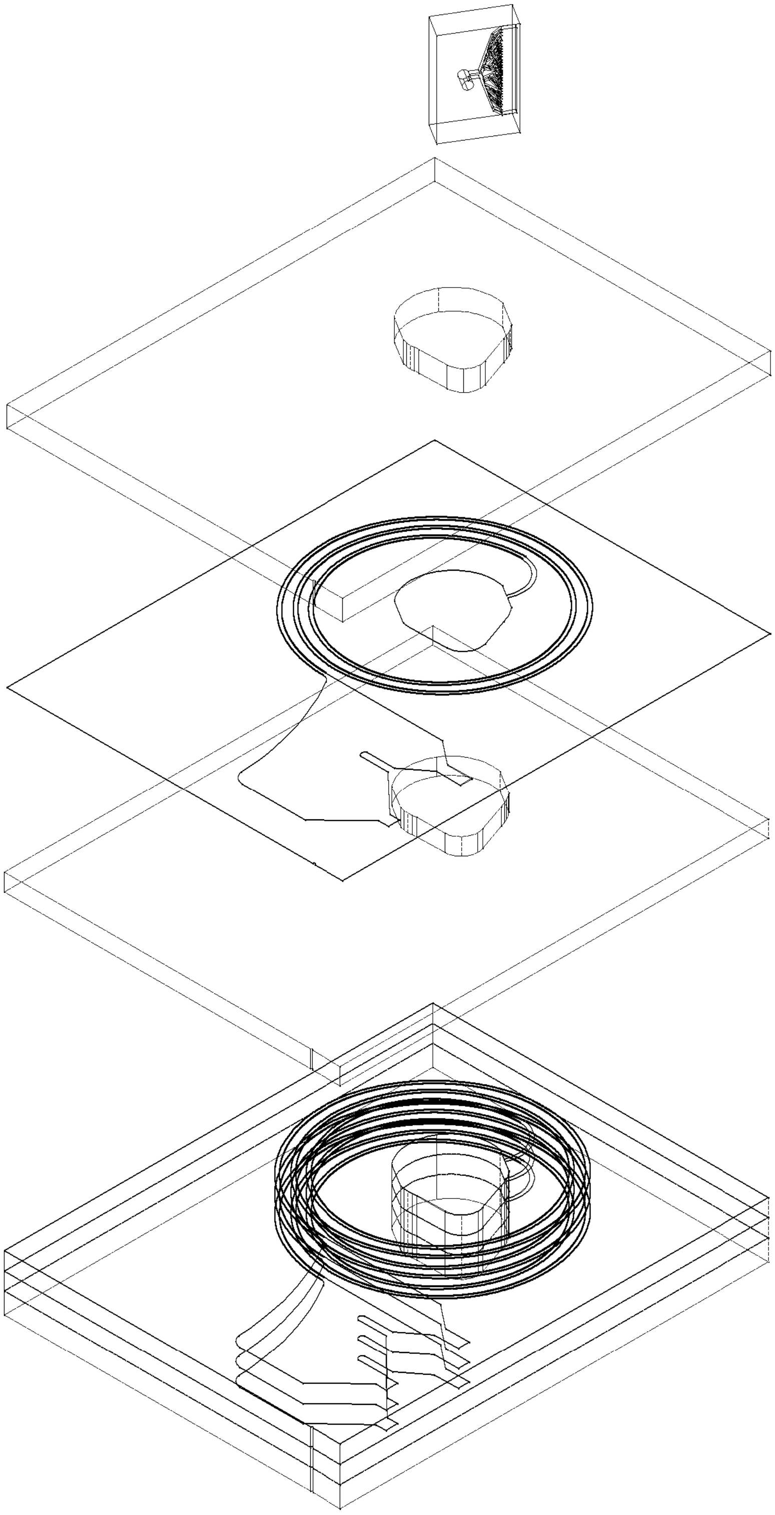
Figure 4:
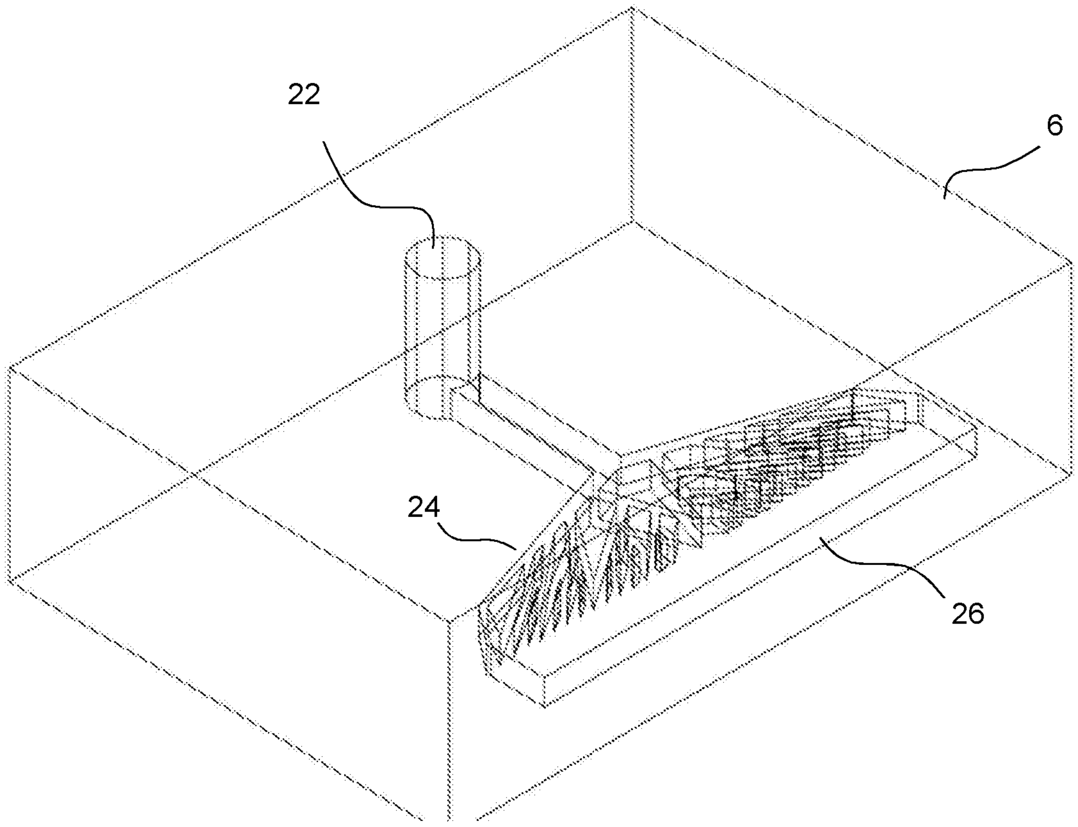
FIG. 4: Perspective view of a common manifold according to one embodiment of the invention.

With reference to FIGS. 1-7, a microfluidic device 1 comprises a stack 2 of 20 layers 4 and a common manifold 6, each layer comprising an inlet 8, a first outlet 10 and a second outlet 12, the inlet connected to the first and second outlets by a spiral channel 14 and an expansion chamber 16. The expansion chamber comprises a divider 18. Fluid is introduced into the inlet of each layer of the device via the common manifold, which extends across each layer in the device and that is oriented approximately perpendicular to the plane 20 of each layer (FIG. 2).

Figure 5:
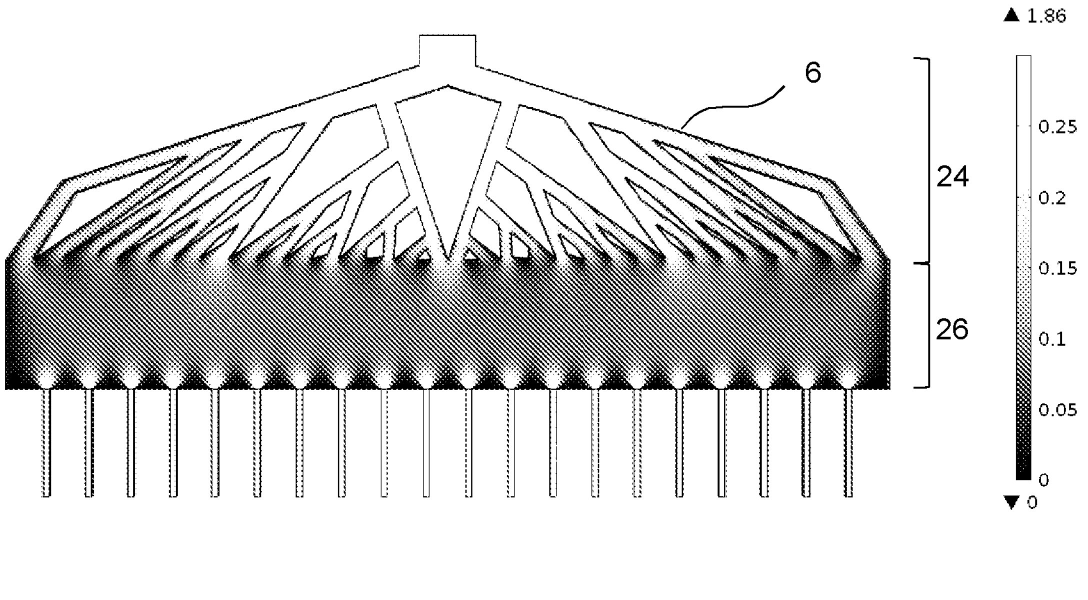
FIG. 5: Flow velocity profile through a common manifold according to one embodiment of the invention.
Figure 6:
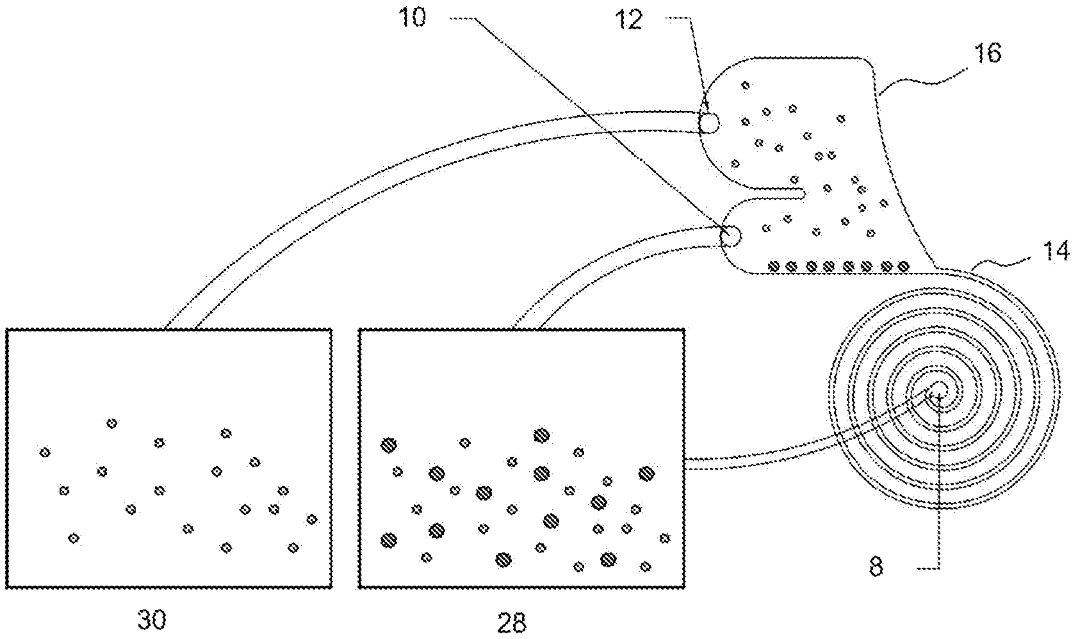
FIG. 6: Schematic plan view of an embodiment of the invention showing focusing of a target population of particles into a focussed particle outlet.

During use, and with reference to FIGS. 5 and 6, fluid to be processed is pumped into the single inlet 22 of the common manifold, through a branched portion 24 of the common manifold, through an open portion 26 of the common manifold where the rate of flow is substantially equalized, and into the inlet of each layer. The manifold equalizes and balances the pressure across the inlet of each layer (see FIG. 5), to ensure that the rate of flow through each channel of each layer is substantially the same. Fluid then flows through the spiral channel of each layer and into the expansion chamber. The fluid is then split by the divider such that fluid is directed towards the first and second outlets. Fluid is then collected from the first outlet and from the second outlet of each layer. Fluid 28 from the first outlets typically comprises particles of all diameters, including a target population of particles having a specific range of diameters. Fluid 30 from the second outlets comprises particles but is substantially devoid of the target population of particulates.

Manufacture of Devices

Each device described below had a channel height to width ratio of 1:6.

A simple method of manufacturing devices according to the invention was developed taking advantage of simply laser cutting of commercial available materials available in a wide range of thicknesses. PMMA, Polycarbonate and PET-G are widely available in thicknesses ranging from 2 μm to 500 μm (and much thicker). Also stainless steel shim is available in thicknesses from 10 μm and up. Each required layer was patterned on the same laser table which helped to reduce the burden of machining features. Porting holes were tapped with common threads (BSPT/NPT, etc) allowing the fitting of standard piping connections.

The fact that there are no island features required for a spiral inertial focusing device allows a simple cut to be used to pattern the channel of the device. Using a laser cutting table to cut the material allows devices to be produced at a high rate, suitable for volume scaling. Depending on the size of the laser table and device footprint, several devices can be cut in a single run. As the footprint of the devices decrease, the yield from a single pass on the table with a single sheet of material increases.

For the larger devices (those with a channel with a height over 100 μm) bonding was achieved by pre-applying adhesive transfer tape to both sides of the device layer, before being cut on the laser table. Pre-applying the tape allows for the areas that would form the floors and ceiling of the channels to be kept clear of adhesive, where applying directly to the port and substrate layers would not remove the adhesive from these areas. Each device layer was stacked on an alignment jig and the tape carrier removed before sliding an interstitial substrate layer down the alignment jig to bond to the device layer surfaces. The bonded layers are removed and flipped to the opposite side, where the process is repeated to assemble each layer of the stack. The use of the adhesive simplifies assembly of the device by avoiding the need for high pressures to allow bonding over a large surface area. End plates are added on either side of the stack to allow an area around the inlet channels for the manifold to seal against. These plates may be machined to accommodate clips to be used to install the manifold, or wedges may be used to apply the sealing pressure. The completed stack was clamped to purge air trapped between layers. Moving the clamps around the stack at hourly intervals allowed the adhesive layer good contact to all surfaces.

Using an adhesive transfer tape is however not suitable for the smaller devices. The pressures involved in running the smaller devices are far higher (~15 bars) and the added thickness of the adhesive would greatly impact the focusing effect in each device. For this reason a different method, using a plasticizer and solvent assisted thermal bonding technique was developed. Plasticizer assisted thermal bonding reduces the temperatures and pressures required to bond surfaces of homogenous polymers together (Duan, H., L. Zhang, and G. Chen, *Plasticizer-assisted bonding of poly (methyl methacrylate) microfluidic chips at low temperature. Journal of Chromatography A.* 1217(1): p. 160-166). However, this technique alone was found to be unrepeatable due to the widely different formulas used in commercial polymers, especially between thick substrate layers (3 mm and 10 mm) and the thinner device layers (50 μm). Often surface coatings are used to modify the properties of materials (PMMA, Polycarbonate etc.) and these coatings can interfere with the plasticizer infiltrating the materials to be bonded. Solvent bonding can however lead to geometry changes where the solvents attack the device layer.

It was found that using solvents (acetone) acting on the substrate layers helps to penetrate the surface coatings and increase the bondable surface area by roughening these surfaces. The device layer is soaked in a plasticizer bath which preserves the geometry. Assembling the layers into a spring driven press which is then baked in an oven leads to a reliable bond. Such a method of assembly was proven effective in the bonding of a single 50 μm channel height device operating at ~8 bars and capable of focusing 5 μm beads.

The manufacture of the manifold was performed using 3D printing technology. The 3D model that was used in the simulation was trans-formatted to the standard .stl file type used for printing. A ⅛" BSPT thread was tapped into the porting hole for connection to a 6 mm push-fit elbow for tubing connection.

A simple rubber gasket was formed from gasket material and adhesive transfer tape applied on a single side in order to reduce slip when wedging the manifold into place.

Figure 7:
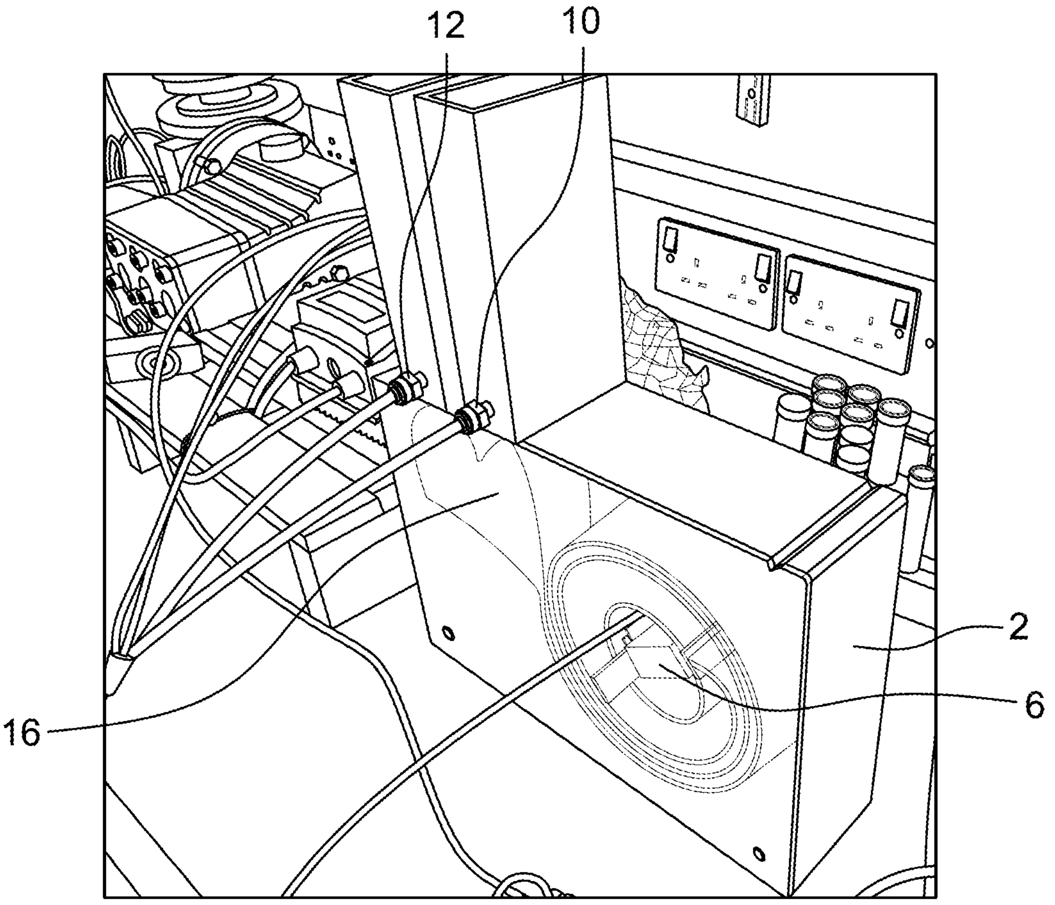
FIG. 7: Stack assembly as operated in lab (showing box section outlets)

Finally, the outlets on the stack are opened by using a band saw to slice along the notched area. These open outlets are encased in a length of box section with outlet ports drilled at an equal height. This allows the outlet backpressure to be evenly distributed across both outlets when the stack is operated on a level surface (FIG. 7).

Results

Running a device comprising multiple layers from a single pressure source would be capable of meeting the volumetric throughput requirements for the application of processing *cryptosporidium* from 1000 L of treated water within 24 hrs.

For example, a device comprising 20 layers each having a minimum channel dimension of 500 μm would typically be able to process 1 L/min.

Generally the layers are stacked in alignment maintaining a constant footprint in two dimensions. For this test 20 layers with a channel height of 500 μm are stacked with an interstitial pitch of 3 mm and additional end plates of 10 mm for sealing the manifold against. The stack is operated at 1 L/min, equating to 50 mL per minute per layer in an ideal case where the pressure is distributed evenly across the stack. This value is chosen as it was demonstrated with single devices that the flow range where focusing of the target particles (250-300 μm) occurs is approximately between 20 mL/min and 80 mL/min. Targeting a flow rate near the middle of this band allows for a maximum of flow rate discrepancy between layers while still allowing the device to function.

A centrifugal pump was used to maintain constant flow through the device. In an ideal implementation a progressive cavity pump may be better suited to pumping liquid media with large particulates with very little shear stress being induced.

The test conditions are summarised in Table 1 below.

TABLE 1

Parallel stack test configuration

| | TEST |
|---|---|
| Conc. RED (38-45 um) | 1.42 g |
| Conc. BLUE (250-300 um) | 2.43 g |
| Initial volume | 7.050 L |
| Volume FO (approx.) | 2.510 L |

FBRM Probe

The probe used is a focused beam reflectance measurement technique (FBRM) G400 Lasentec (Mettler Toledo). This probe is composed of a tight laser beam rotating at a controlled speed. As the beam scans the solution containing the particles, the light reemitted from one edge of particles to the opposing side is also detected. By coupling the duration of this reemission and the speed of rotation of the laser beam, the chord length across particles can be deduced.

The chord length therefore is an indication of the particle size. For a unique bead size and if the number of particles analysed by the probe is large enough, the mean of the chord length distribution should be the particle diameter.

Figure 8:
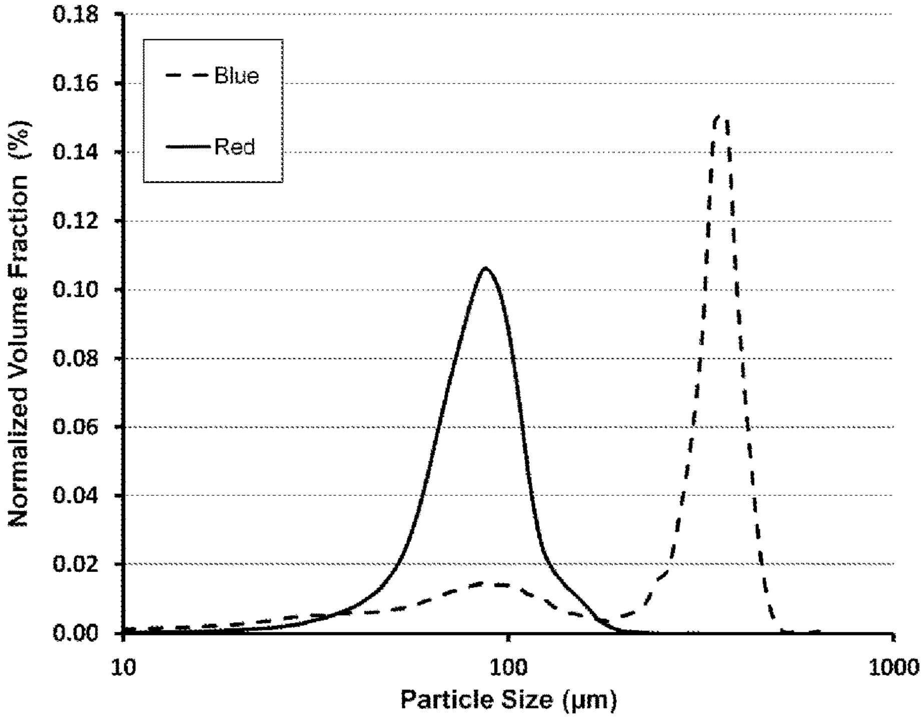
FIG. 8: Chord length distribution for calibration.

The FBRM probe was calibrated with fresh beads to establish a chord length distribution profile for both the red (38-45 μm, H) and blue (250-300 μm, L) beads individually as shown in FIG. 8.

A test run was conducted using tap water as the fluid medium. Though there is a risk of a small amount of contaminants appearing in the results, the relatively high concentration of micro-beads which are used was expected to greatly reduce any impact (as a percentage of particles) of these. The sample was run in recirculation mode with only the focused outlet returning to the inlet reservoir from the beginning of the test.

Figure 9:
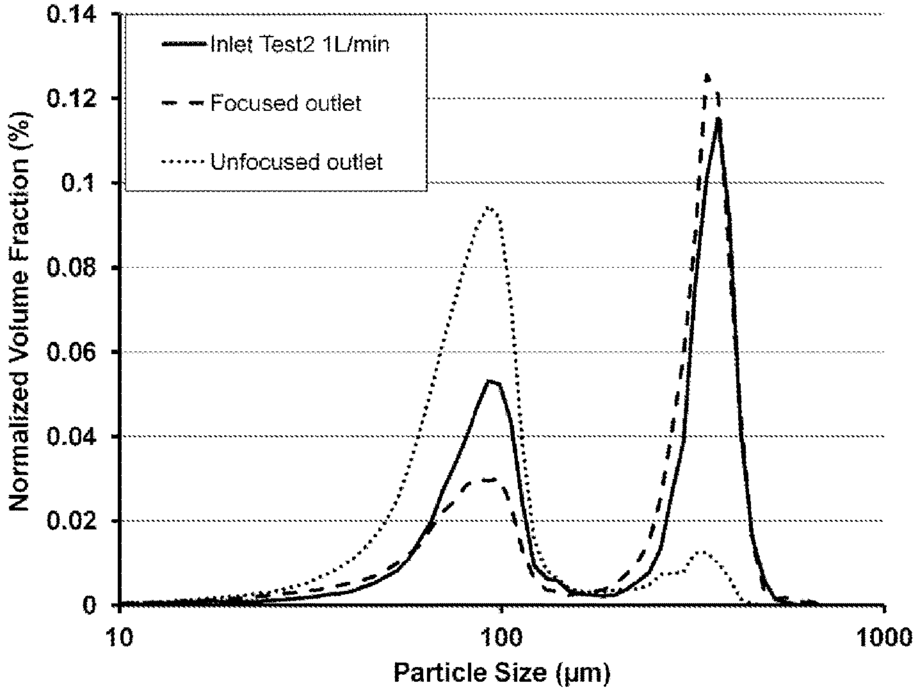
FIG. 9: Chord length distribution for TEST 2 (in TAP WATER)
Figure 10:
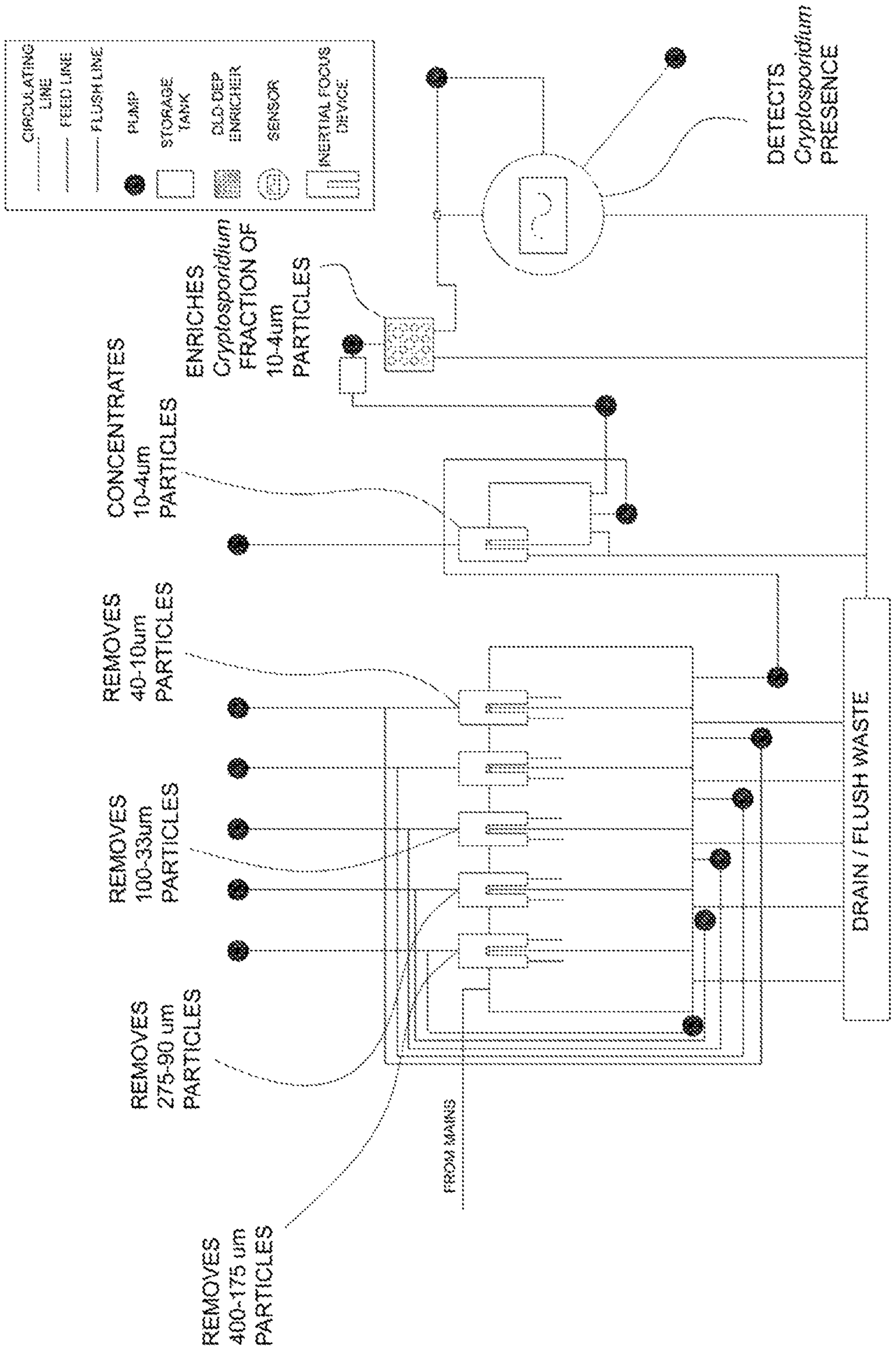
FIG. 10: Schematic view of a system according to one embodiment of the invention comprising five devices connected in sequence.

The high level of depletion of the large particles from the unfocused outlet and a concentration of the large particle fraction is clearly demonstrated in FIG. 9. Unexpectedly there also appears to be a large increase in concentration of the small particle fraction, though it is likely this is an artefact of the sampling method coupled with the non-neutral buoyancy of the red beads in particular. This can also be seen as there appears to be enrichment of the small particle population in the focused outlet as well (see Table 2).

Though a small number of high chord length particles appear to be present in the unfocused outlet there may be three contributing factors. Firstly, while fragmentation of the beads is minimised with a complete volume cycle number of approximately 1.7 circulations, there will still be a number of beads fragmented into pieces which may not be focused despite having a single dimension large enough to be detected as a large particle in the FBRM probe. Secondly, because of the method of probing with the FBRM equipment there is some probability of the same beads or fragments of beads being detected more than once in any given sample, because of the agitation of the 100 mL sample volume.

TABLE 2

Estimated concentration based on FBRM measurements for TEST 2

| TEST 2 | RED (g/L) | BLUE (g/L) |
|---|---|---|
| Inlet | 0.155 | 0.189 |
| Focused outlet | 0.335 | 0.653 |
| Unfocused outlet | 0.406 | 0.039 |

Conclusion for Parallel Stage

While only 20 layers were run simultaneously from a single pressure source, it is considered that simply adapting the interstitial spacing of devices could allow for many more layers to be run in a similar configuration. This would be necessary to allow the smallest profile devices to achieve a similar volumetric throughput to the larger stages preceding them. A design for 30 μm layer stacks were created by scaling the design (with minor modifications) which could achieve a stack of 300 layers pitched at 100 μm interstitial spacing. Conceivably this could be increased to 500 layers by reducing the pitch further to 50 μm. For the 300 layer device case the volumetric throughput for each module would be approximately 150 mL/min (300×500 μL/min). In a 500 layer device this would be 250 mL/min. therefore 4 devices would be capable of matching the volumetric flow requirements. It is considered that a "super-manifold" may be used prior to each device to allow these 4 devices to be run from a single pressure source. This could create a fractal-like effect where the larger manifolds distribute pressure to a subsequent set of manifolds to distribute these pressures across useful functional devices.

Cascade of Multiple Devices

A system comprising three devices of one embodiment of the invention (a "cascade") was used to process water and sequentially remove three populations of particles from the water. The three devices have channel heights of 500 μm ("500 μm device"), 300 μm ("300 μm device") and 200 μm ("200 μm device").

Micro-beads are used to represent specific particle size populations as shown in Table 3

TABLE 3

Micro-bead properties table

| Colour | Density (g/cc) | Size Range μm |
|---|---|---|
| Green | 1.3 | 1-5 |
| White | 1.3 | 10-27 |
| Violet | 1.0 | 53-63 |
| Orange | 1.0 | 75-90 |
| Yellow | 1.0 | 150-180 |
| Blue | 1.0 | 250-300 |

The devices tested consist of spiral inertial focusing devices capable of entraining particles larger than a critical diameter towards the inner wall of the device. Reference points are illustrated where high speed camera microscopy was used to analyse particle behaviour in flow during operation.

Particles smaller than the critical diameter are distributed across both the focused and unfocused outlets. Two operating modes have been examined:

1. Recirculation, where the focused outlet is directly connected to the inlet for concentrating large particles (i.e. focused large particles)
2. Single Circulation.

Both modes have been investigated for determining the concentration and separation efficiencies of the polystyrene beads (Table 3) from large volumes of water.

Determination of the Size Distribution by FBRM

Preliminary Tests

For these preliminary tests, two solutions of polystyrene beads (see Table 4) are tested in the same device in order to determine the critical diameter of particles being focused and the separation efficiency of these particles.

TABLE 4

Experimental conditions for the two preliminary tests performed with FBRM measurements.

| Test | Test 1 | Test 2 |
|---|---|---|
| Beads | Green, White, Violet and Orange | Violet, Orange, Yellow and Blue |
| Initial volume | 420 mL | 550 mL |
| Focused outlet volume | 100 mL | 100 mL |
| Flow rate | 17.5 mL/min | 20.4 mL/min |

These solutions flow through the inertial focusing device at a constant flow rate in recirculation mode (focused outlet connected to the reservoir of the device inlet in order to further concentrate focused beads). Large beads are expected to be separated through the focused outlet while small ones should be present in both outlets. The system is running until the inlet volume reaches about 100 mL (minimum volume required for probe measurements, note that dilutions are possible for experiments with smaller volumes). The initial solution and both outlets are then analysed with a FBRM probe at the LISBP laboratory (Toulouse White Biotechnology TWB, France).

Results for Isolated Beads and DI Water

Firstly, the chord length distribution of each bead family is processed independently in DI water and surfactant to calibrate the chord length to the particle size.

Chord length distributions present a Gaussian profile for violet, orange, yellow and blue particles. For green and white particles, the distribution is however bimodal (as presented in Table 5). In order to understand if these deviations from the expected sizes are due to the probe or to the beads, the size of isolated beads has been analysed by laser diffraction using a Mastersizer™ (Malvern Instruments, UK). Based on these results, bead sizes provided by the manufacturer are in good agreement with the measured ones. It appears therefore that the probe overestimates the bead size for unknown reasons. Deviation between FBRM measurements and expected sizes (based on manufacturer information) are provided in Table 5.

TABLE 5

Most likely chord length.

| Beads | Maximum of the distribution μm | Deviation to the mean size |
|---|---|---|
| Green | 4.4-13.3 μm | — |
| White | 28.5-92.3 μm | — |

TABLE 5-continued

| Most likely chord length. | | |
|---|---|---|
| Beads | Maximum of the distribution µm | Deviation to the mean size |
| Violet | 98.9 µm | 71% |
| Orange | 149.6 µm | 81% |
| Yellow | 226.5 µm | 37% |
| Blue | 342.8 µm | 24% |

Based on calibration curves, the lack of correspondence between chord length and particle diameter can be corrected if needed. However, this size overestimation does not alter the potential of FBRM to characterize separation efficiencies in spiral channels.

Results for the Cascade

Results for Test 1 (De-Ionised water) showed two main chord length distributions are measured at the inlet corresponding to the presence of large (orange and violet) and small (green) beads (chord lengths around 10 and 100 µm respectively).

Figure 11:
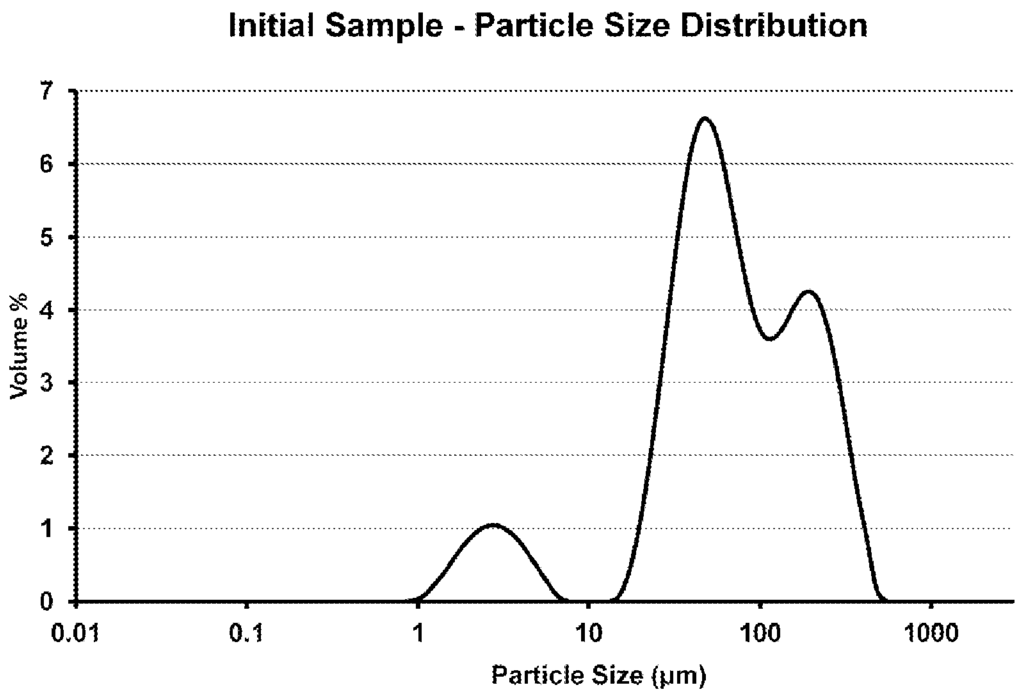
FIG. 11: Chord length distribution for 500 μm device—inlet.
Figure 12:
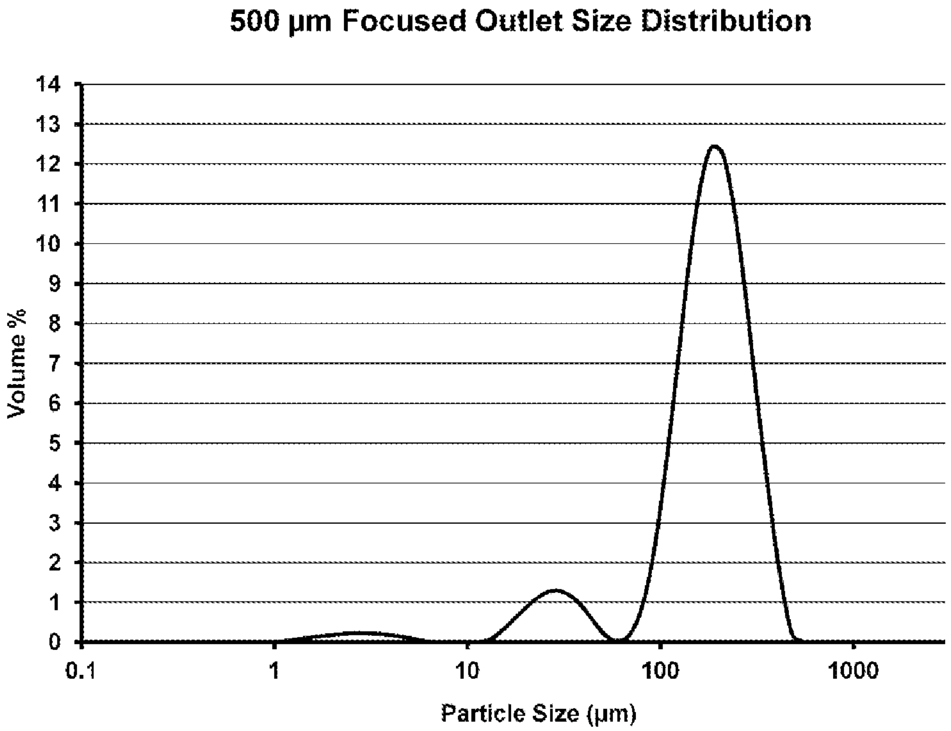
FIG. 12: Chord length distribution for 500 μm device—large outlet.

Based on these results and by comparing the maximum fraction number of each distribution, concentration factors and rates, as defined by Equations 1 and 2, can be deduced.

$$\text{Concentration factor} = \frac{\text{Max } NF \text{ Outlet}}{\text{Max } NF \text{ Inlet}}, \tag{1}$$

Where NF is the number fraction in FIG. 11 and i indicates either the focused or unfocused outlet.

$$\text{Concentration rate} = \frac{\text{Max } NF\ Outlet_i - \text{Max } NF \text{ Inlet}}{\text{Max } NF \text{ Inlet}}. \tag{2}$$

TABLE 6

Concentration factor and efficiency of small and large particles at the focused and unfocused outlets for Test 1.

| | Concentration factor | Concentration rate |
|---|---|---|
| Small part.-unfocused outlet | 1.1 | 8% |
| Small part.-focused outlet | 0.9 | −12% |
| Large part.-unfocused outlet | 0.06 | −94% |
| Large part.-focused outlet | 2.25 | 125% |

Concentration factors above 1 indicate a concentration of the tested beads at the outlet. It is clearly indicated that large particles are almost completely removed from the unfocused outlet, thereby confirming the potential of the proposed technique for separating particles. Large beads are 2.25 times more concentrated in the focused outlet than in the initial solution which correlates well with the number of cycles (420 ml*0.5^2.25=~90 ml volume). This system appears to be a powerful separating and concentrating tool for sorting particles from large volumes of water.

Results in Cascade Mode Operation

For this experiment, a mix of beads (see Table 7) is incorporated in the 500 µm device. The small outlet (containing the unfocused smallest particles) is then incorporated in the 300 µm device whose small outlet is then placed into the 200 µm device. Results are shown in FIGS. 12-18.

Figure 13:
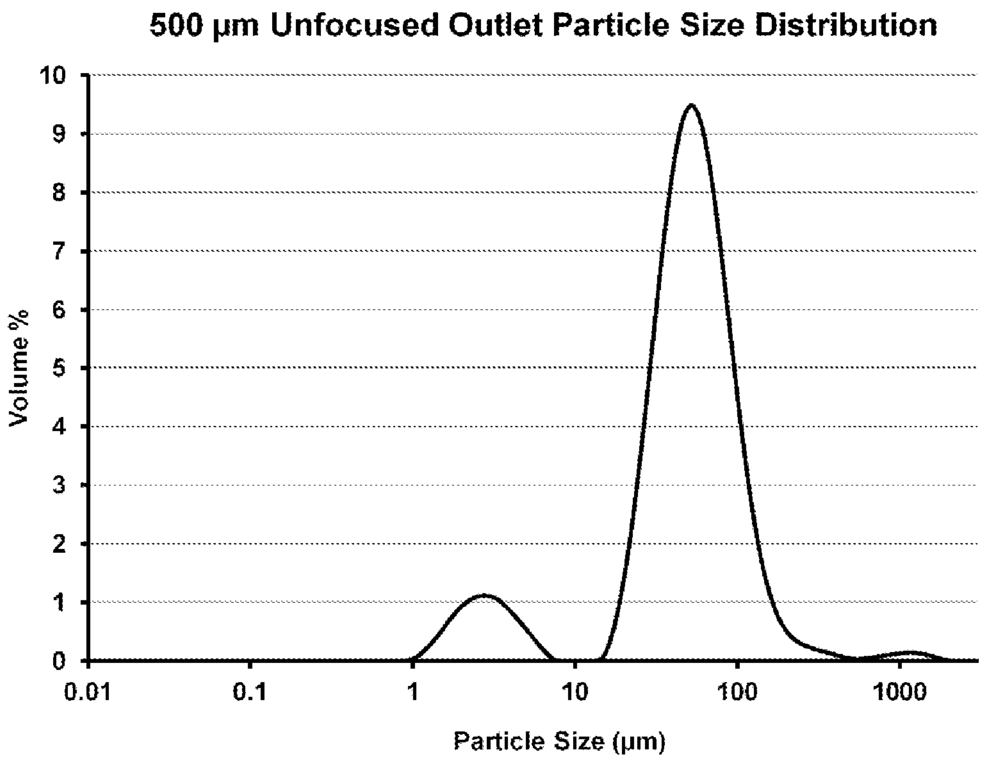
FIG. 13: Chord length distribution for 500 μm device—unfocused outlet.
Figure 14:
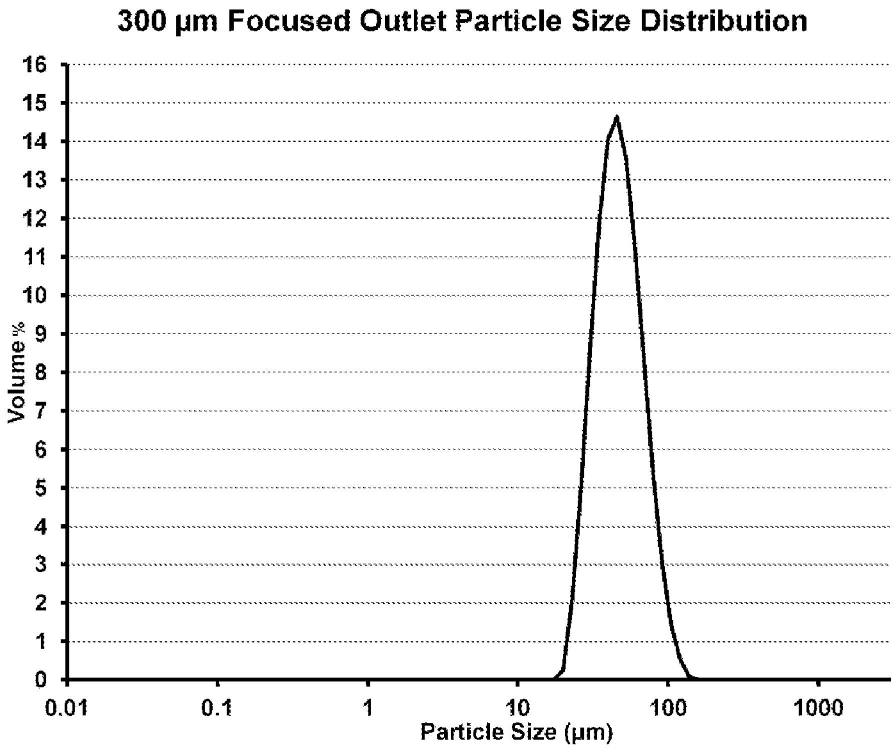
FIG. 14: Chord length distribution for 300 μm device—focused outlet.

FIG. 13 represents the distribution measured at the focused outlet of the 500 µm device. It clearly appears here that the largest beads (yellow and blue) are almost completely separated in this outlet while some smaller ones are still present. This result is also highlighted by the absence of large beads at the unfocused outlet of the device.

Figure 15:
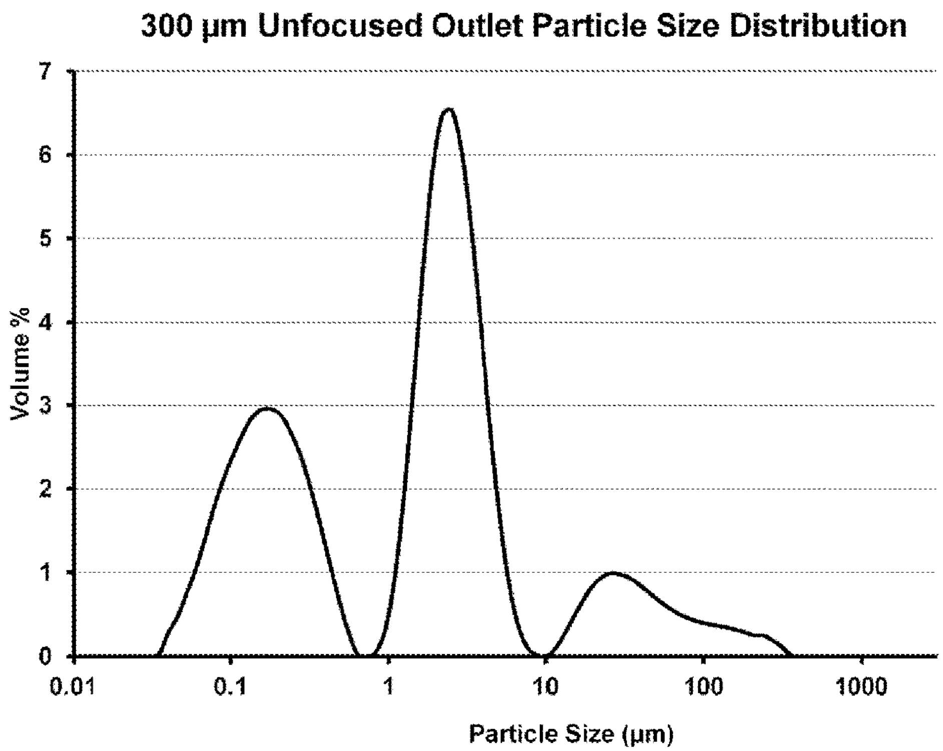
FIG. 15: Chord length distribution for 300 μm device—unfocused outlet.
Figure 16:
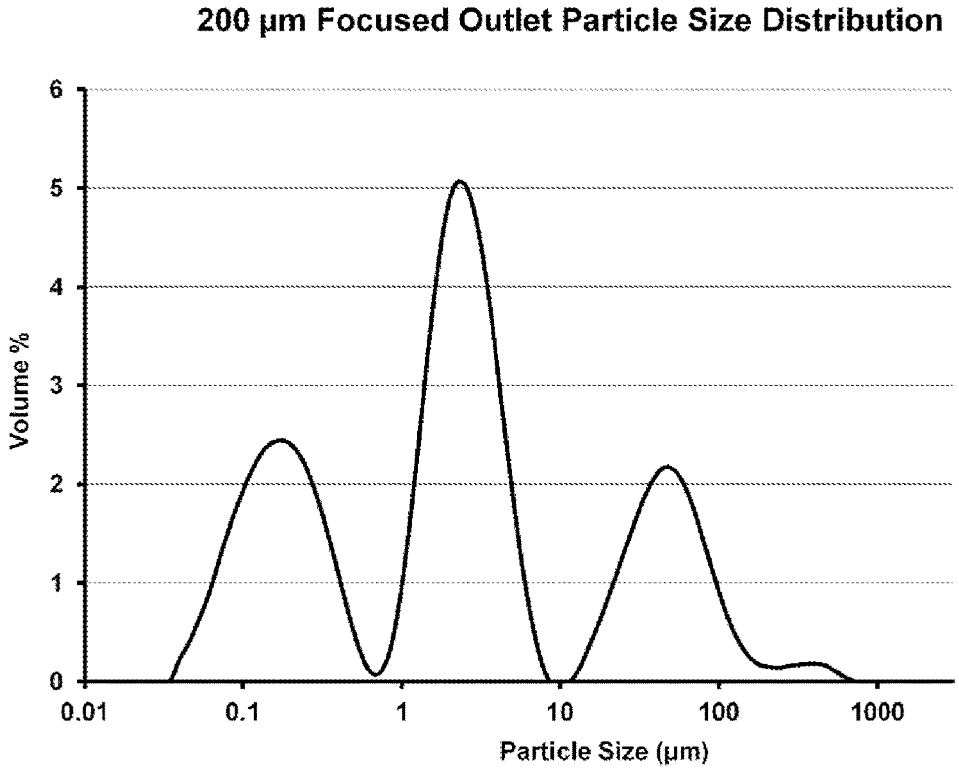
FIG. 16: Chord length distribution for 200 μm device—focused outlet.
Figure 17:
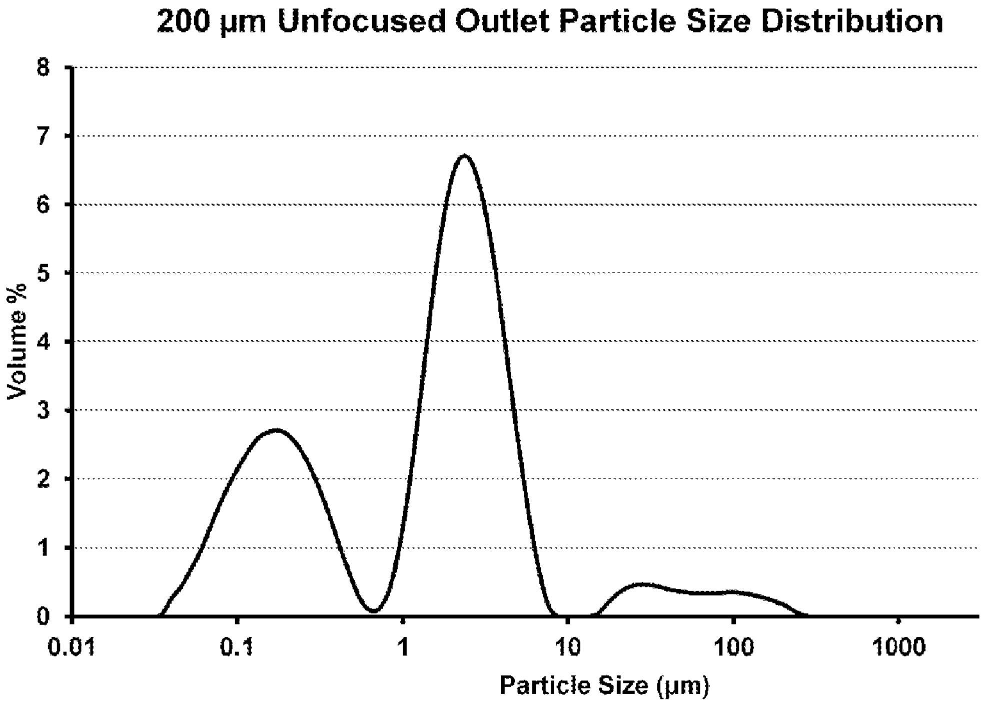
FIG. 17: Final result from cascade (200 μm unfocussed outlet)

The inlet of the 300 µm is thus mainly composed with red, violet and orange beads (38-90 µm) and green ones (1-5 µm). In the same way, almost all the largest particles are removed at the focused outlet although some fragments are visible in the unfocused outlet (FIGS. 15 and 16). The white beads (10-27 µm) also appears at this outlet. At the focused outlet of the 200 µm device, all the remaining particles are detected.

TABLE 7

| Mass of beads added for the cascade experiment. | |
|---|---|
| Beads | Mass (g) |
| Green | 0.0731 |
| White | 0.0749 |
| Red | 0.1343 |
| Violet | 0.1058 |
| Orange | 0.0797 |
| Yellow | 0.1245 |
| Blue | 0.1030 |

For this test, the quantification is based on results obtained with the MASTERSIZER. The distribution at the inlet of the largest device is presented in FIG. 11.

Testing with Live *Cryptosporidium*

A further test was carried out at the Scottish Water central laboratory where a low concentration (100 oocyst/mL) of *Cryptosporidium parvum* spiked standard filter elution buffer was processed in the 30 µm profile device at 400 µL/min. Due to the constraints of using a syringe pump a single pass through the device was performed with 5 mL of sample volume.

The elution buffer was spiked with 500 enumerated oocysts in a cuvette and vortexed for 2 mins to suspend the oocysts. The sample was transferred into the syringe by withdrawal through a needle. Trapped air in the syringe was ejected by tapping the syringe in a vertical orientation and expelling the air with modest liquid loss (some 10's of µL estimated loss). The sample was then processed through the 30 µm device and outputs were collected in two further cuvettes.

The resulting outputs were then filtered on a 0.2 µm membrane filter with vacuum pressure, being transferred from the cuvettes using a pipette. Subsequently standard staining processes were used directly on the filter membrane and the resulting counts were performed manually with an inverted fluorescence microscope.

The resulting counts were:

| | |
|---|---|
| Focused Outlet 30 µm device | 128 positive identifications |
| Unfocused Outlet 30 µm device | 0 positive identifications |

Though the recovery rate from this test is relatively low (approx 25%) it suggests that the live, unlabelled and low concentration of oocysts were successfully focused with every recovered oocyst exiting from the expected outlet. This could not be confirmed visually due to the low concentration, lack of fluorescence and high velocity past the microscope objective.

Losses due to transfer and dead volume were substantial and further examination of the device found that several oocysts (40-50 approx.) aggregated near the inlet of the device, where several sharp angles would cause stagnation zones to form in the flow. This is due to the design of the 30 μm chip, which was manufactured by Epigem Ltd (Redcar, UK) in SU-8 using standard photolithographic techniques.

In order to represent the expected focusing effect on oocysts, representative 4 μm fluorescent micro-beads were also processed in the 30 μm device using the same flow conditions.

2 μm micro-beads were also tested in the 30 μm device and were seen to remain unfocused. This indicates the cut-off for focusing in this device is between 2 μm and 4 μm in the given flow regime (400 μL/min).

After these tests, a technique to successfully bond device layers without impacting geometry (no adhesive transfer tape) was developed that allowed for a 50 μm device to be manufactured with laser-micromachining. This device was tested with 5 μm beads and was able to successfully focus this particle size.

The success of the bonding technique which enables the manufacture of these devices to be performed should significantly simplify the manufacture of stacks of devices where photolithographic techniques would be cumbersome to achieve the necessary yields.

Conclusion

It has been shown that the strategy of cascading sequentially scaled homogenous designs of spiral inertial focusing devices can be used to successfully separate and concentrate specific particle size populations. It is shown that the removal of the larger sizes is sufficiently effective to ensure that smaller devices later in the sequence do not become clogged by those particles larger than could pass into the channels.

The results from the Mastersizer instrument show most clearly that after a cascade from 500 μm to 300 μm and 200 μm device profiles only a very small (<0.5% by volume) fraction of detections indicate a larger object. It is considered that these may be the product of fragments from larger beads whose geometry changed in a way to interfere with focusing and it seems likely that some of these few detections are bubbles caused by the surfactant which is added to the water to de-aggregate the micro-beads, as the solution is constantly agitated to disperse the particles even when entering into the Mastersizer instrument.

The results from the FBRM probe show similar characteristics, though it is difficult to understand the correlation between the chord length and actual size which is represented. The advantage of the FBRM probe over the Mastersizer instrument is that it allows for a relatively high confidence when estimating the concentration effects from recirculation.

Additionally, it was shown that very low concentrations of the target analyte, *Cryptsosporidium parvum* (100 oocysts/mL), were able to be focused successfully in the 30 μm device. Though the recovery efficiency was severely affected by the test equipment and setup, every recovered oocyst was retrieved from the correct outlet of the device. Modifications to the porting, pumping and internal surface coating of the devices would allow for better recovery efficiency.

Further Embodiment

Figure 18:
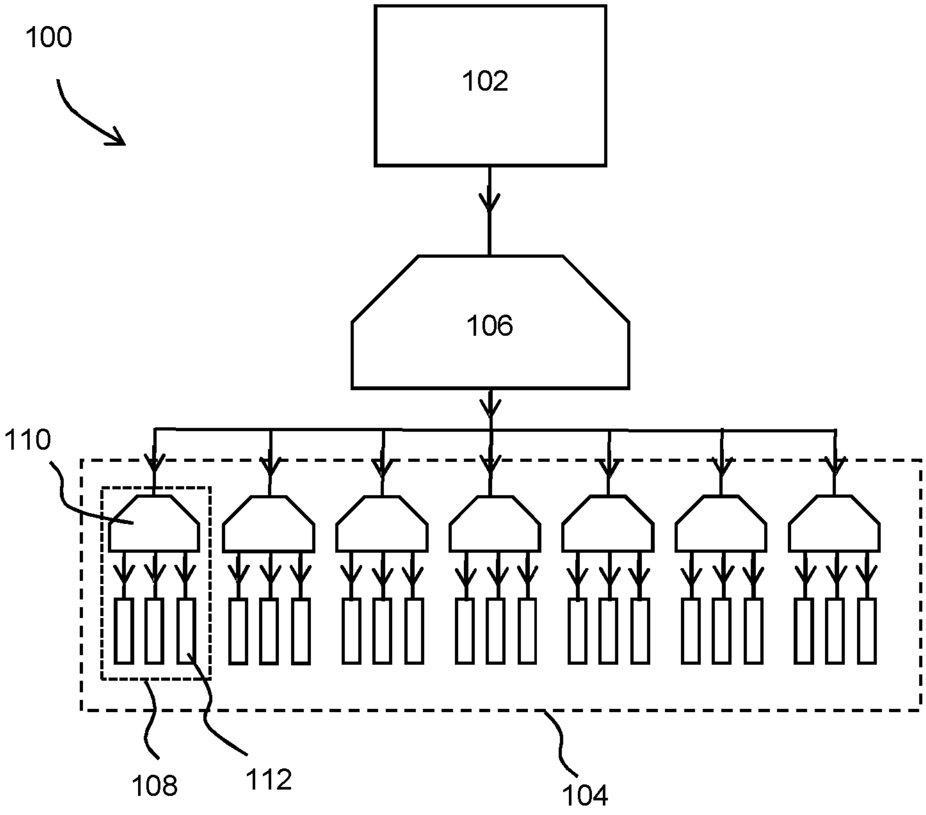
FIG. 18: Schematic view of a system according to an embodiment of the invention comprising a super-manifold and a plurality of microfluidic devices.

With reference to FIG. 18, a system 100 comprises a pump 102 connected to seven microfluidic devices 104 via a super-manifold 106 (acting as a further common manifold). Each device 108 is as according to the first embodiment described above. It will be appreciated that FIG. 18 is a schematic of the system and has been simplified for clarity. Typically, for example, the common manifolds would be in contact with inlets of each layer of the device, whilst in FIG. 18 a separation is shown to allow the flow between the common manifold and the layers to be shown.

It will be further appreciated that the number of microfluidic devices is not limited to the seven shown in FIG. 18. For example, the number of devices may be ten, twelve, fifteen, twenty, twenty five or thirty.

Figure 19:
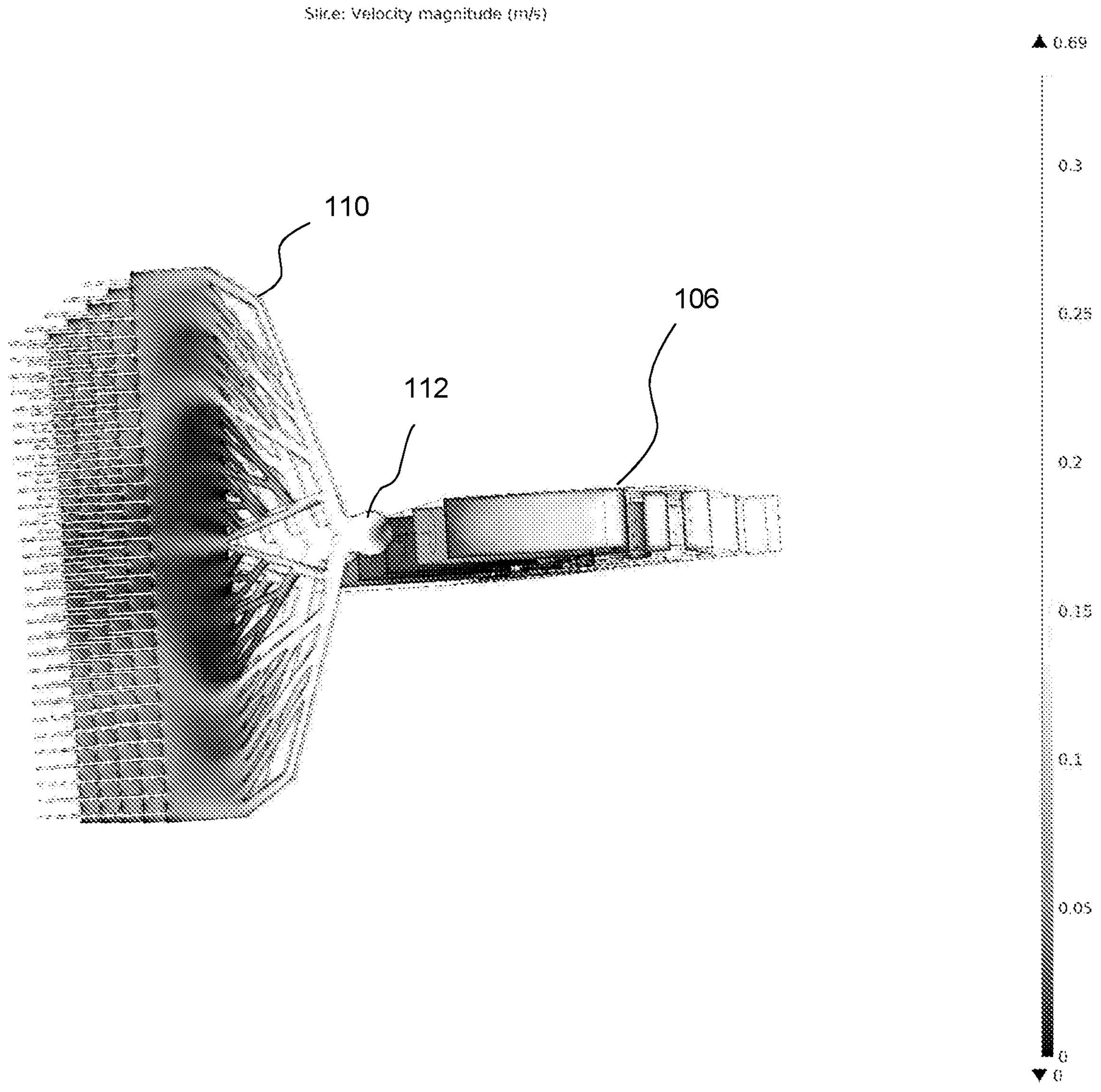
FIG. 19: Flow velocity profile through a further common manifold according to one embodiment of the invention.
Figure 20:
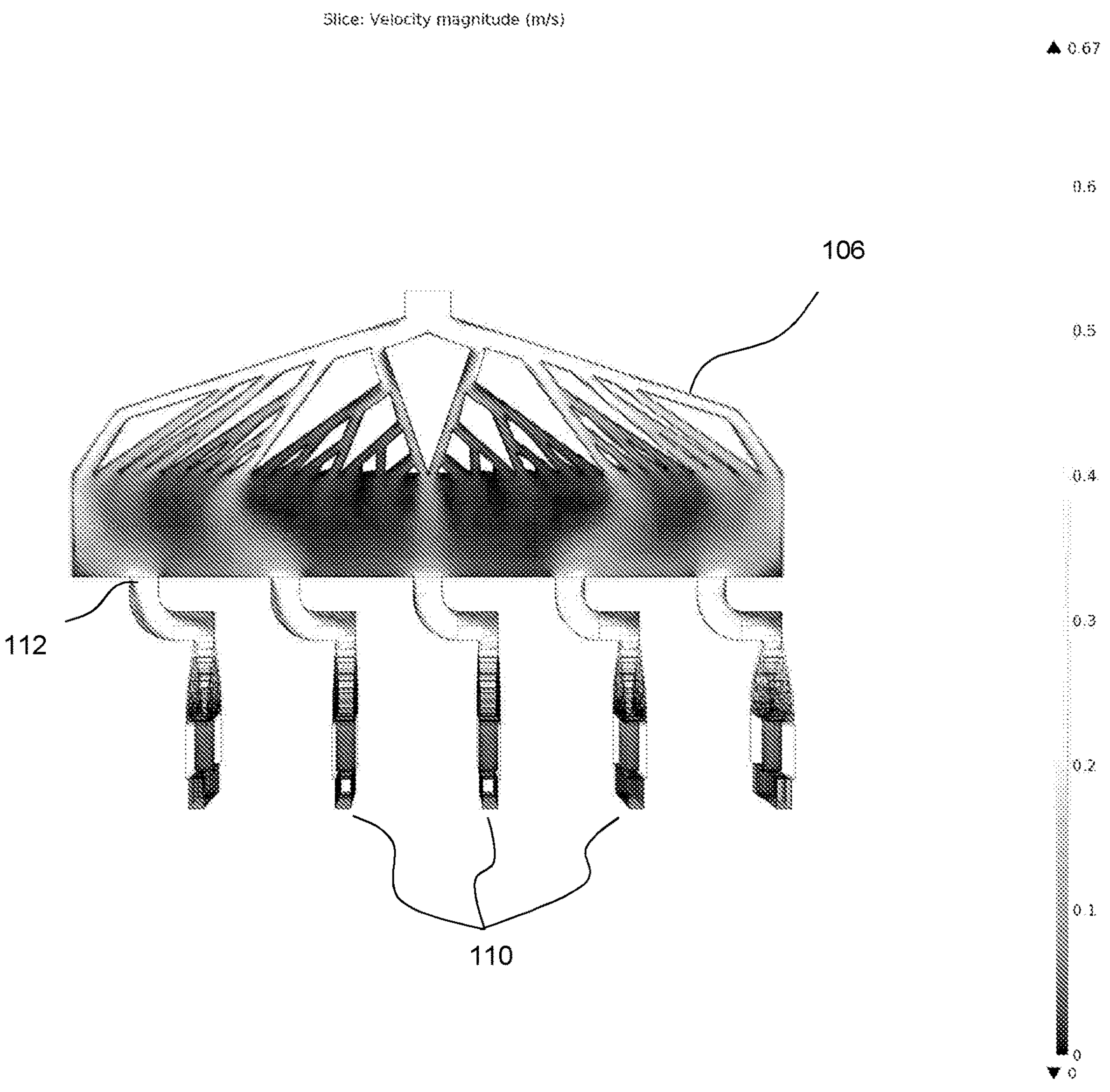
FIG. 20: Flow velocity profile through a further common manifold according to one embodiment of the invention.

Fluid is driven by the pump through the super-manifold, through the common manifold 110 of each device within the plurality of devices, through the channel of each layer 112 of each device. With reference to FIGS. 19 and 201, the super-manifold and common manifolds of each separate device are configured to equalize and balance the pressure across the inlet of each layer of each device, to ensure that the rate of flow through each channel of each layer is substantially the same. For example, FIG. 20 shows a flow simulation for an embodiment comprising a super-manifold and five common manifolds of five devices as described above. As can be seen, the flow rate at the inlets 112 of the common manifolds are substantially the same, and therefore, the flow rate of fluid being processed by each device in the system will be substantially the same.

As a result, the system allows a single pump to drive fluid through a plurality of devices to process a large volume of fluid whilst ensuring that the flow rate is substantially the same through each channel of each device within the system such that each channel will process the fluid to concentrate particulates of the same diameter or size.

The person skilled in the art will appreciate that described embodiments of the invention are merely illustrative examples of the invention and that further variations and modifications of the inventions are within the scope of the invention.

REFERENCES

1. Nugen, S. R., et al., PMMA biosensor for nucleic acids with integrated mixer and electrochemical detection. Biosensors and Bioelectronics, 2009. 24(8): p. 2428-2433.
2. Xu, S. and R. Mutharasan, Detection of *Cryptosporidium parvum* in buffer and in complex matrix using PEMC sensors at 5 oocysts mL-1. Analytica Chimica Acta. 669(1-2): p. 81-86.
3. Di Carlo, D., et al., Equilibrium Separation and Filtration of Particles Using Differential Inertial Focusing. Analytical Chemistry, 2008. 80(6): p. 2204-2211.
4. Beech, J. P., P. Jonsson, and J. O. Tegenfeldt, Tipping the balance of deterministic lateral displacement devices using dielectrophoresis. Lab on a Chip, 2009. 9(18): p. 2698-2706.
5. Holm, S. H., et al., Separation of parasites from human blood using deterministic lateral displacement. Lab on a Chip.
6. Lee, J.-W., M.-Y. Yi, and S.-M. Lee, Inertial focusing of particles with an aerodynamic lens in the atmospheric pressure range. Journal of Aerosol Science, 2003. 34(2): p. 211-224.
7. Russom, A., et al., Differential inertial focusing of particles in curved low-aspect-ratio microchannels. New journal of physics, 2009. 11: p. 75025.

The invention claimed is:

1. A microfluidic device comprising a plurality of layers and a common manifold, each layer within the plurality of layers comprises an inlet and at least two outlets, the inlet being in fluid communication with each of the at least two outlets via a channel, the inlet of each layer within the plurality of layers being in fluid communication with the common manifold, such that fluid may flow from the common manifold through each channel of each layer within the plurality of layers via the inputs of each respective layer to the at least two outlets of each layer, wherein the common manifold comprises an inlet, a branched portion and a manifold outlet in direct fluid communication with the inlet of the channel of each layer within the plurality of layers, such that fluid flows during use, from the inlet of the common manifold to the inlet of each layer within the plurality of layers via the branched portion and the manifold outlet of the common manifold such that the flow rate of fluid passing through the channel of each layer within the plurality of layers is substantially the same, such that, during use, a fluid comprising a target population of particles having a specified range of diameters may be processed by the device by flowing from the common manifold through the channels of each layer within the plurality of layers via the inlets of those layers, and fluid collected from a first outlet of each layer within the plurality of layers comprises the target population of particles, and fluid collected from a second outlet of each layer within the plurality of layers is substantially devoid of the target population of particles.

2. A device according to claim 1, wherein the common manifold comprises a single inlet.

3. A device according to claim 1, wherein the channel of each layer within the plurality of layers is curved.

4. A device according to claim 3, wherein the channel of each layer within the plurality of layers forms a spiral.

5. A device according to claim 1, wherein, during use, fluid passes through each layer within the plurality of layers in parallel.

6. A device according to claim 1, wherein the inlet of each layer within the plurality of layers is open.

7. A device according to claim 1, wherein the at least two outlets of each layer within the plurality of layers are open.

8. A device according to claim 6, wherein the inlet and the at least two outlets of each layer within the plurality of layers are open.

9. A device according to claim 1, wherein the plurality of layers form a stack of layers such that each layer within the stack of layers substantially covers the preceding layer within the stack.

10. A device according to claim 1, wherein the channel of each layer within the plurality of layers has substantially the same dimensions.

11. A device according to claim 1, wherein the width of the channel of each layer within the plurality of layers is about three to about ten times the height of the channel of each layer within the plurality of layers.

12. A device according to claim 11, wherein the width of the channel of each layer within the plurality of layers is about four to about seven times the height of the channel.

13. A device according to claim 12, wherein preferably, the width of the channel of each layer within the plurality of layers is about six times the height of the channel.

14. A device according to claim 1, wherein the plurality of layers comprises at least ten layers.

15. A device according to claim 14, wherein the plurality of layers comprises at least twenty layers.

16. A device according to claim 1, wherein each layer within the plurality of layers comprises an expansion chamber between the at least two outlets and the channel of that layer.

17. A device according to claim 16, wherein the expansion chamber comprises a divider.

18. A device according to claim 1, wherein the channel of each layer within the plurality of layers comprises a coating that resists binding by particles within the fluid to the surface of each channel.

19. A method of use of a device according to claim 1, the method comprising the steps:

a providing a fluid comprising a target population of particles;

b driving the fluid into the single inlet of the common manifold of the device at a first rate of flow; and c collecting the fluid from the at least two outlets of each layer within the plurality of layers, wherein the fluid from a first outlet of each layer comprises the target population of particles, and fluid from a second outlet is substantially devoid of the target population of particles.

20. A method according to claim 19, wherein the fluid from the first outlet comprises the majority of the target population of particles.

21. A method according to claim 20, wherein the fluid from the first outlet comprises substantially all of the target population of particles.

22. A system for removing populations of particles from a fluid or increasing the concentration of populations of particles within a fluid, the system comprising a plurality of devices according to claim 1, the second outlet of a first device is in fluid communication with the inlet of a subsequent device, wherein the channels of the first device are dimensioned to focus particles of a first range of diameters into the first outlet of the first device, and the channels of the second device are dimensioned to focus particles of a second range of diameters into the first outlet of the second device, such that fluid comprising populations of particles with diameters within the first and/or second range of diameters may be sequentially removed from the fluid as the fluid passes through the plurality of devices.

23. A system according to claim 22, wherein fluid is processed by each device in the system using the method according to claim 19.

24. A system according to claim 22, wherein the diameter or range of diameters of the target populations removed by each subsequent device within the system is smaller than the previous device, such that each subsequent device removes smaller particles than the preceding device in the system.

25. A system according to claim 22, wherein the first outlet of each layer of each device in the system of the present invention is in fluid communication within the inlet of the common manifold of that device, such that fluid comprising the target population of particles is further processed by that device to reduce the volume of fluid comprising the target population of particles, thereby concentrating the target population of particles.

26. A system according to claim 22, wherein the common manifold of each device within the plurality of devices is in fluid communication with a reservoir for that device.

27. A system according to claim 22, wherein the fluid is water or another aqueous liquid.

28. A system according to claim 22, wherein the fluid is a non-aqueous liquid.

29. A system according to claim 28, wherein the fluid is an oil.

30. A system for removing populations of particles from a fluid or increasing the concentration of populations of particles within a fluid, the system comprising a plurality of devices according to claim 1 and a further common manifold connecting a fluid source to the common manifolds of each device within the plurality of devices.

31. The system according to claim 30, wherein the further common manifold is configured to ensure that the flow rate of fluid passing through the inlet of each common manifold within the plurality of devices is substantially the same.

* * * * *